United States Patent
Tsai et al.

(10) Patent No.: US 11,624,776 B2
(45) Date of Patent: Apr. 11, 2023

(54) TEMPERATURE ADJUSTING DEVICE

(71) Applicant: ONE TEST SYSTEMS, Santa Clara, CA (US)

(72) Inventors: Chen-Lung Tsai, Saratoga, CA (US); Gene Rosenthal, Santa Cruz, CA (US)

(73) Assignee: ONE TEST SYSTEMS, Santa Clara, CA (US)

( * ) Notice: Subject to any disclaimer, the term of this patent is extended or adjusted under 35 U.S.C. 154(b) by 0 days.

(21) Appl. No.: 17/557,182

(22) Filed: Dec. 21, 2021

(65) Prior Publication Data

US 2023/0051010 A1    Feb. 16, 2023

(30) Foreign Application Priority Data

Aug. 13, 2021    (TW) .................................. 110129879

(51) Int. Cl.
*G01R 31/28*    (2006.01)

(52) U.S. Cl.
CPC ..... *G01R 31/2875* (2013.01); *G01R 31/2863* (2013.01)

(58) Field of Classification Search
CPC ............ G01R 31/2831; G01R 31/2874; G01R 31/2877
See application file for complete search history.

(56) References Cited

U.S. PATENT DOCUMENTS

| | | | |
|---|---|---|---|
| 2005/0041393 A1* | 2/2005 | Tustaniwskyi | G01R 31/2891 361/699 |
| 2016/0379863 A1* | 12/2016 | Naor | H01L 21/68707 414/800 |
| 2018/0050455 A1* | 2/2018 | Charpie | H01L 21/6838 |

* cited by examiner

*Primary Examiner* — Tung X Nguyen
(74) *Attorney, Agent, or Firm* — Li & Cai Intellectual Property (USA) Office

(57) ABSTRACT

A temperature adjusting device including a main body and a pressing component is provided. The main body includes a first main body thru-hole and a second main body thru-hole. The main body has a first fluid channel and a second fluid channel therein, the first fluid channel is in spatial communication with the first main body thru-hole, and the second fluid channel is in spatial communication with the second main body thru-hole. The pressing component partially protrudes from one side of the main body, the pressing component has a fluid accommodating slot therein that is in spatial communication with the first fluid channel and the second fluid channel. A fluid having a predetermined temperature can enter into the main body from the first main body thru-hole, enter into the fluid accommodating slot through the first fluid channel, and exit the main body through the second main body thru-hole.

10 Claims, 24 Drawing Sheets

TEMPERATURE ADJUSTING DEVICE

CROSS-REFERENCE TO RELATED PATENT APPLICATION

This application claims the benefit of priority to Taiwan Patent Application No. 110129879, filed on Aug. 13, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a temperature adjusting device, and more particularly to a temperature adjusting device applicable in a testing apparatus configured to test a plurality of chips.

BACKGROUND OF THE DISCLOSURE

In a conventional chip (i.e. IC chip or memory) testing apparatus, two testing operations are performed by respectively operating a plurality of chips in a high temperature environment and in a low temperature environment, so as to test whether the chips can be normally operated in the high temperature environment and the low temperature environment.

Generally, the testing operation performed in the high temperature environment is implemented as follows. A circuit board having the chips disposed thereon is disposed in an oven, a temperature in the oven is increased to a predetermined high temperature by using a hot air blower, and accordingly, the chips can be tested in the high temperature environment. However, one of the most severe issues in the testing operation is that when the oven is heated through the hot air blower, the temperatures at different areas in the oven may be different. Therefore, parts of the chips are tested in the predetermined high temperature, parts of the chips are tested in an environment having a temperature less than the predetermined high temperature, and parts of the chips may even be tested in an environment having a temperature greater than the predetermined high temperature. Accordingly, the testing result becomes unreliable.

Similarly, when the chips are tested in an environment having a predetermined low temperature, the circuit board having the chips disposed thereon is disposed in a freezer or a cold room, so that the issues mentioned above can exist in a similar manner.

SUMMARY OF THE DISCLOSURE

In response to the above-referenced technical inadequacies, the present disclosure provides a temperature adjusting device primarily configured to modify the above-mentioned issues (i.e., conventionally, when chips are required to be tested in an environment having a high temperature or a low temperature, the chips may not be tested at a uniform and predetermined temperature, and the testing result is accordingly unreliable).

In one aspect, the present disclosure provides a temperature adjusting device configured to be disposed on a chip testing machine. The chip testing machine includes at least one chip testing socket, and the at least one chip testing socket is configured to carry a chip under test. The temperature adjusting device includes a main body and at least one pressing component. The main body includes at least one first fluid channel and at least one second fluid channel therein. The main body has at least one first main body thru-hole and at least one second main body thru-hole, the at least one main first body thru-hole is not in spatial communication with the at least one second main body thru-hole, the at least one first main body thru-hole is in spatial communication with the at least on first fluid channel, and the at least one second main body thru-hole is in spatial communication with the at least one second fluid channel. The at least one pressing component partially protrudes from one side of the main body. The at least one pressing component includes a fluid accommodating slot therein, the fluid accommodating slot is in spatial communication with the at least one first fluid channel, and the fluid accommodating slot is in spatial communication with the at least one second fluid channel. Other portions of the at least one first fluid channel excluding one portion of the at least one first fluid channel that is in spatial communication with the fluid accommodating slot is not in spatial communication with the at least one second fluid channel. The at least one pressing component has a wall portion, the wall portion has a pressing surface, and the wall portion is an end wall of the fluid accommodating slot. The at least one first main body thru-hole is provided so that a fluid having a predetermined temperature flows into the main body, the fluid entering into the main body from the at least first one main body thru-hole is configured to be guided by the at least one first fluid channel to flow into the fluid accommodating slot, and the fluid in the fluid accommodating slot is configured to enter into the at least one second fluid channel, flow along the at least one second fluid channel, and exit the main body from the at least one second main body thru-hole. When the temperature adjusting device is fixed on the chip testing machine, the pressing surface of the at least one pressing component presses on a surface of the chip under test disposed on the at least one chip testing socket, or the pressing surface is disposed near the surface, and the fluid arranged in the fluid accommodating slot is configured to exchange heat with the chip under test through the wall portion.

Therefore, in the temperature adjusting device provided by the present disclosure, by the design of the first fluid channel, the second fluid channel, the pressing component, and the fluid accommodating slot, each of the chips can singly exchange heat with the fluid in the fluid accommodating slot. In this way, the chips are able to be tested at the correct predetermined temperature in the chip testing operation.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
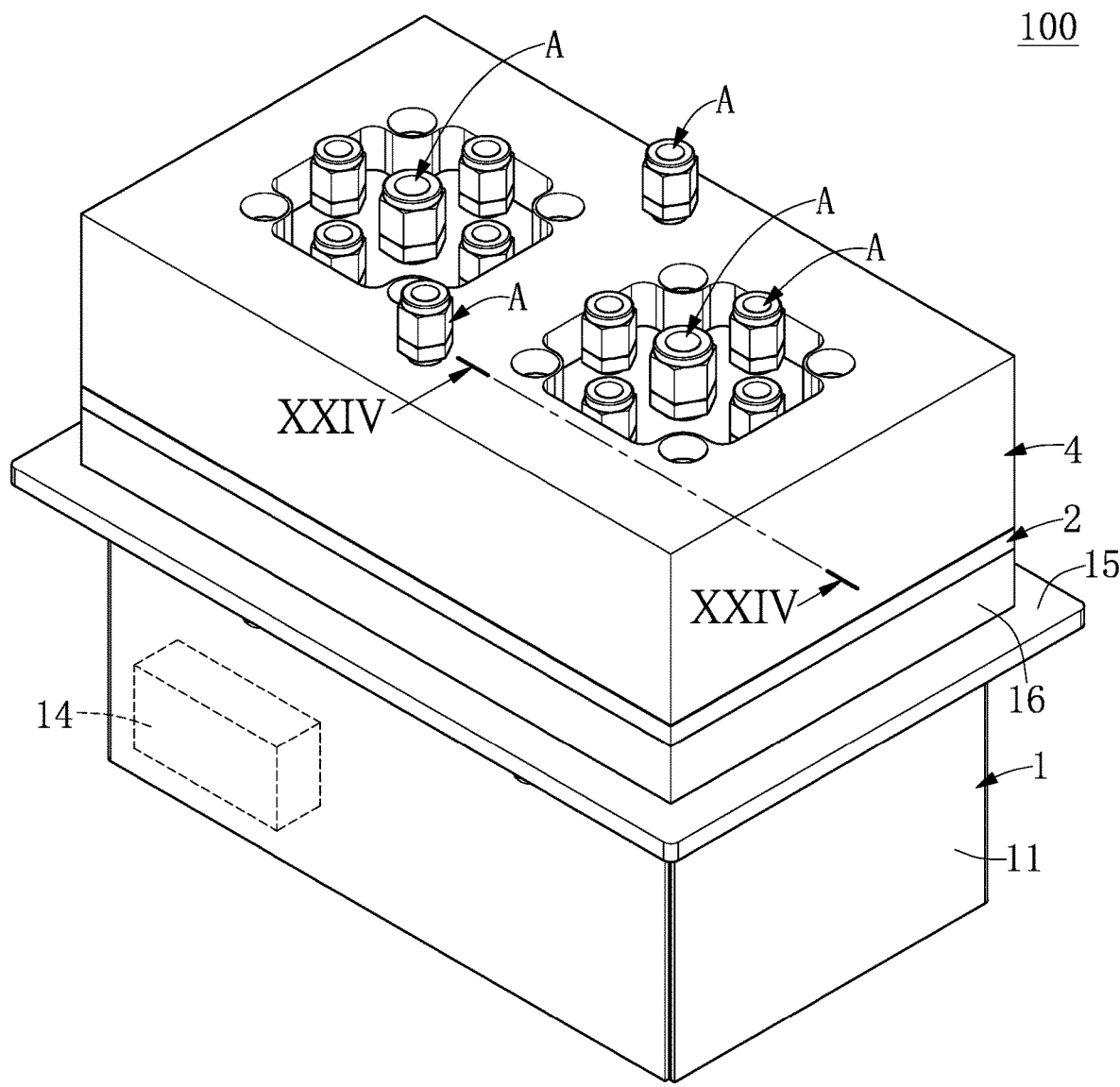
FIG. 1 is a schematic view of a chip testing apparatus of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 5, a chip testing apparatus 100 of the present disclosure includes a chip testing machine 1, a chip carrying sleeve 2, two temperature adjusting devices 3, and a lid 4. The quantity of the chip carrying sleeve 2, the quantity of the temperature adjusting devices 3, and the quantity of the lid 4 are not limited to those shown in the figures of the present disclosure. In other embodiments, the chip testing apparatus 100 can be provided to not include the chip carrying sleeve 2. In other embodiments, the quantity of the temperature adjusting devises 3 included by the chip testing apparatus 100 can be one or at least three. In a practical application, the chip testing apparatus 100 can be connected to an air suction apparatus, or the chip testing apparatus 100 can include the air suction apparatus. In addition, each of the temperature adjusting devices 3 of the chip testing apparatus 100 can be connected to a fluid supply apparatus, or the chip testing apparatus 100 can include the fluid supply apparatus.

Figure 7:
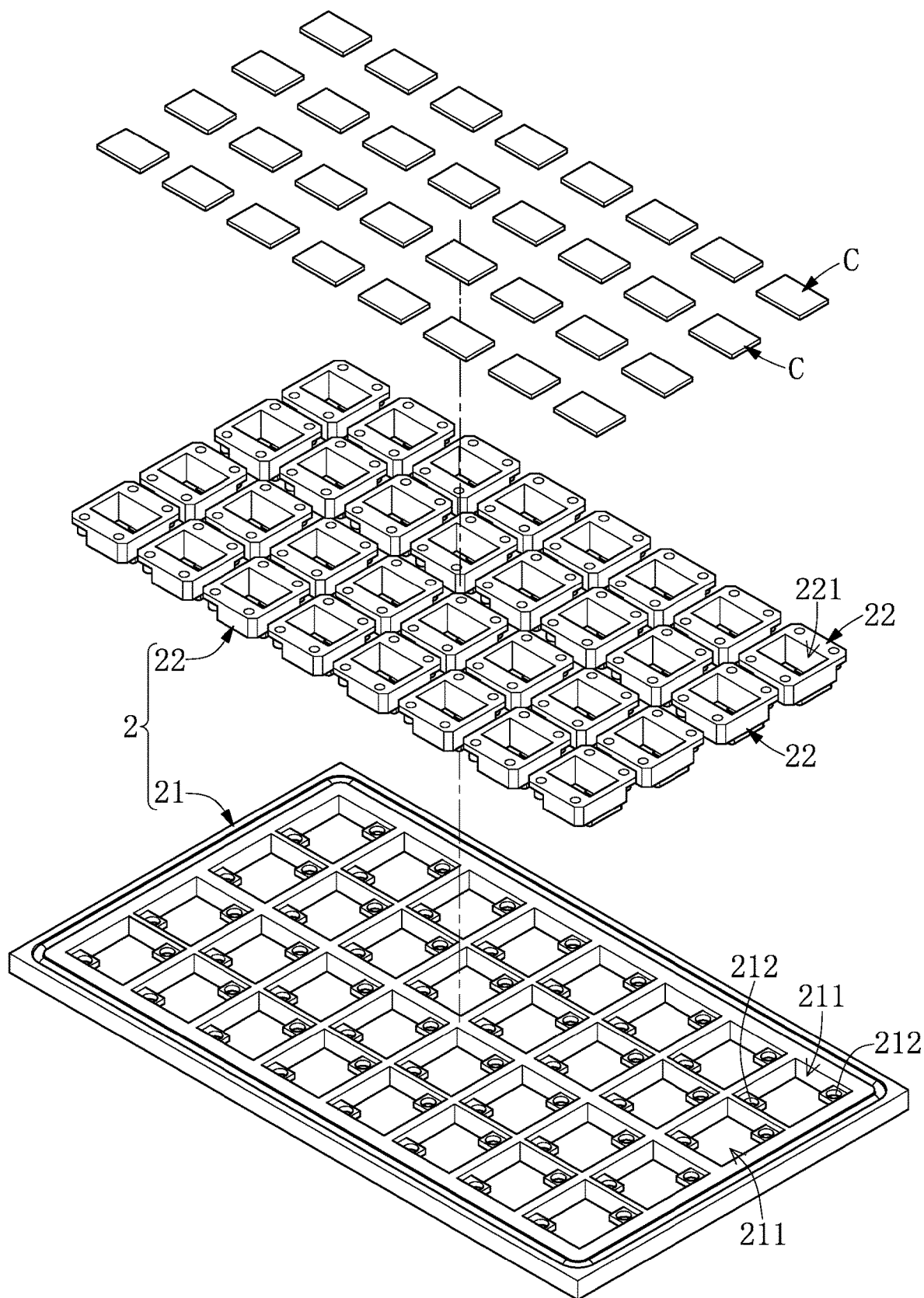
FIG. 7 is an exploded view of a chip carrying sleeve of the chip testing apparatus and a chip of the present disclosure.

The chip testing machine 1 can include a machine body 11, two substrates 12, thirty-two chip testing sockets 13, and a testing module 14. The machine body 11 is a relevant mechanical or electronical component, excluding the substrates 12, the chip testing sockets 13, and the testing module 14, that is configured to maintain the normal operation of the chip testing machine 1. For example, the machine body 11 can include a shell and a power supply module. The substrates 12 are disposed on the machine body 11. The substrates 12 can be various types of rigid circuit boards according to practical requirements. The thirty-two chip testing sockets 13 are disposed on the substrates 12, and each of the chip testing sockets 13 is configured to carry a chip C under test. The quantity of the substrates 12, the quantity of the chip testing sockets 13, and the quantity of the testing module 14 are not limited to those shown in the figures of the present disclosure. In a practical application, the sort of each of the chip testing sockets 13 can be decided according to the sort of the chips C under test (as shown in FIG. 7), but the present disclosure is not limited thereto.

The testing module 14 is disposed in the machine body 11, the testing module 14 is electrically connected to each of the chip testing sockets 13, and the testing module 14 is configured to perform a testing operation to each of the chips C under test on the corresponding one of the chip testing sockets 13.

In one embodiment of the present disclosure, the chips C can be various types of memory chips (e.g., NAND flash), the testing module 14 can perform at least one of a reading test, a writing test, and an electrical property test to each of the memory chips, and the testing module 14 can include a pattern generator (i.e., PG), a parametric measurement unit (i.e., PMU), a device power supply (i.e., DPS), and a driver. Naturally, in a practical application, the components such as unit, module, circuit, and the like included by the testing module 14 can be adjusted according to the chips C under test, and the testing module 14 is not limited to include the above-mentioned unit, module, circuit, and the like.

In other embodiments, the chip testing machine 1 can include a plurality of the testing modules 14, the chip testing sockets 13 can be defined into a plurality of groups, and the chip testing sockets 13 arranged in a same group are connected to the same one of the chip testing modules 14. In this way, the signal transmission between each of the testing modules 14 and the chips C connected thereto can be faster and does not easily decay. More specifically, if the substrates 12 having the thirty-two chip testing sockets 13 disposed thereon are connected to only one signal input source, and when the signal transmitted by the signal input source is transmitted from one side of the substrates 12 to another side of the substrates 12, the signal obviously decays, and the chip testing result is accordingly inaccurate.

Figure 4:
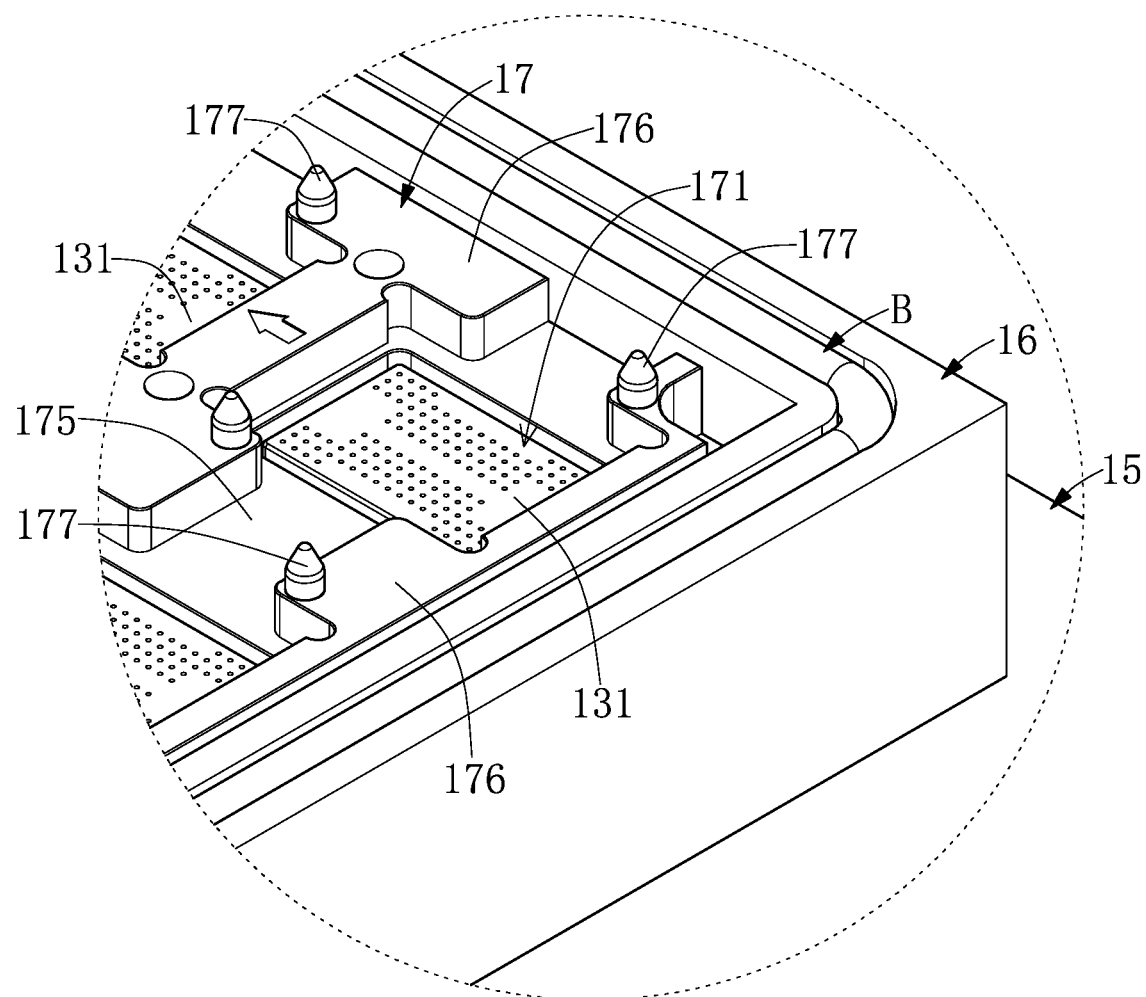
FIG. 4 is a partial enlarged view of a chip testing machine of the chip testing apparatus of the present disclosure.
Figure 5:
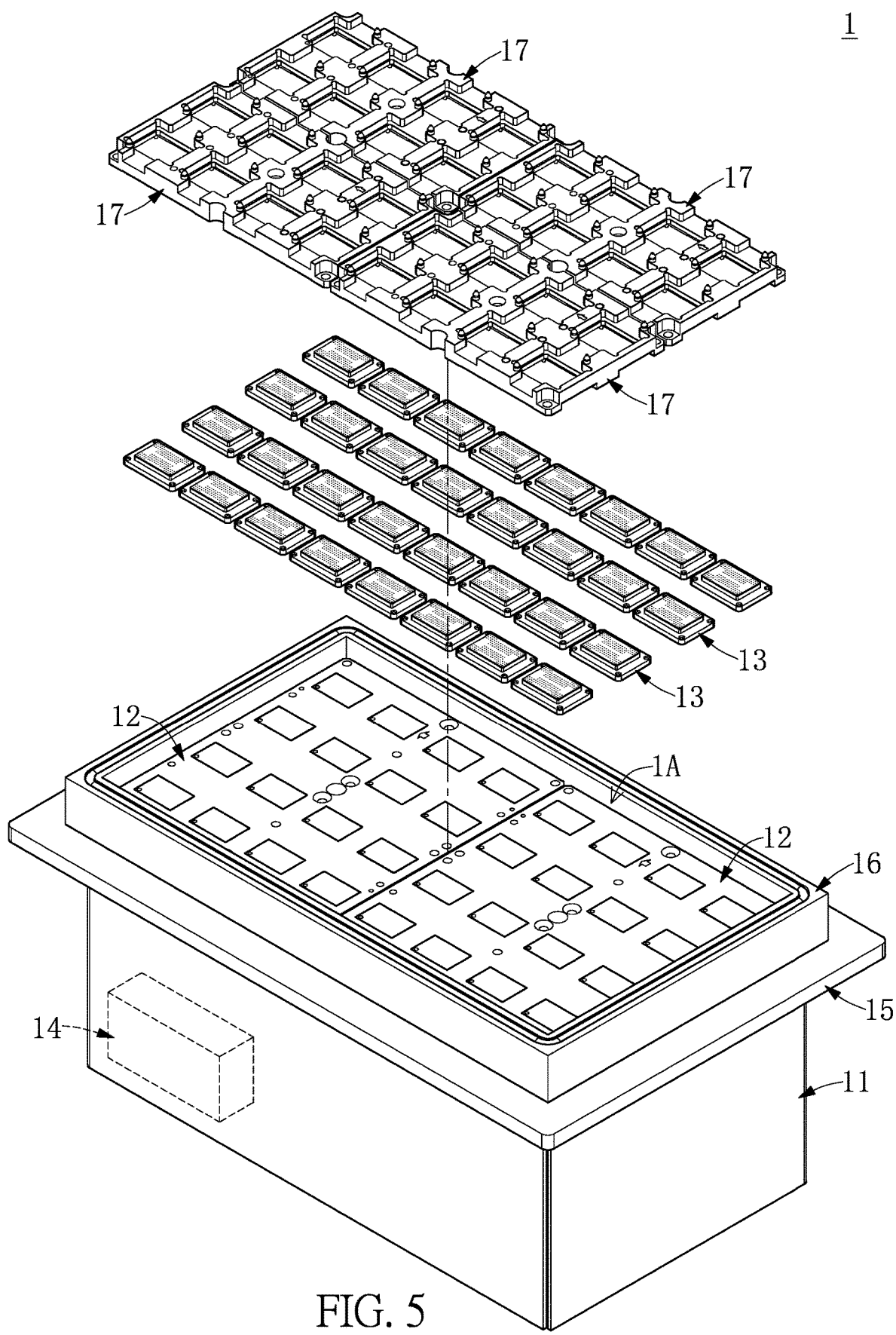
FIG. 5 is a partial exploded view of the chip testing machine of the chip testing apparatus of the present disclosure.
Figure 6:
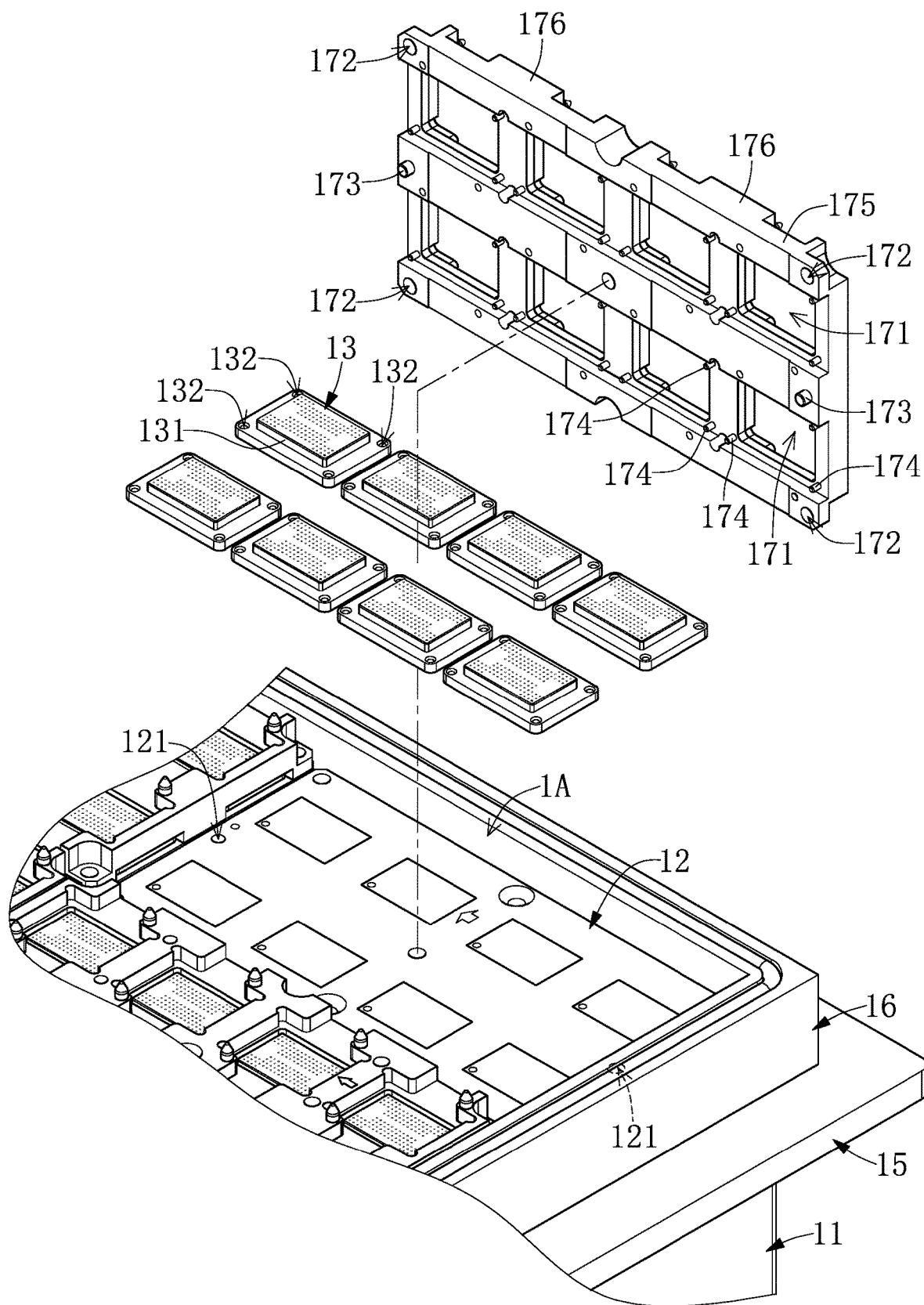
FIG. 6 is an exploded view of an auxiliary positioning component and a plurality of chip testing sockets of the chip testing apparatus of the present disclosure.

Referring to FIG. 4 to FIG. 6, moreover, in a practical application, the chip testing machine 1 can further include a bottom board 15, a hollow frame 16, and four auxiliary positioning components 17. The bottom board 15 is disposed on one side of the machine body 11, and the two substrates 12 are disposed on one side of the bottom board 15. The bottom board 15 is primarily configured to fix the two substrates 12 and the testing module 14. The structure and the dimensions of the bottom board 15 can be selectively designed according to the quantity of the substrates 12, the structure of the substrates 12, the quantity of the testing module 14, and the structure of the testing module 14, and the figures only show one embodiment of the present disclosure.

The hollow frame 16 is disposed on the one side of the bottom board 15 having the substrates 12 disposed thereon, the hollow frame 16 surrounds the two substrates 12, the two substrates 12 are correspondingly arranged in the hollow frame 16, the hollow frame 16 and the substrates 12 jointly define an accommodating slot 1A, and an electrical connection structure (e.g., a pad) of each of the substrates 12 that is configured to be electrically connected to each of the chip testing sockets 13 is correspondingly arranged in the accommodating slot 1A. A height of each of the chip testing sockets 13 is less than or equal to a depth of the accommodating slot 1A, and when each of the chip testing sockets 13 is fixed on one of the substrates 12, each of the chip testing sockets 13 does not protrude from the hollow frame 16.

The four auxiliary positioning components 17 are detachably disposed on one side of the substrates 12, and each of the auxiliary positioning components 17 is arranged in the accommodating slot 1A. In a practical application, each of the auxiliary positioning components 17 can be, for example, detachably fixed to the one side of the substrates 12 through a plurality of screws, but the present disclosure is not limited thereto. In the present embodiment, the quantity of the auxiliary positioning components 17 disposed in the hollow frame 16 is four, but the quantity of the auxiliary positioning components 17 disposed in the hollow frame 16 is not limited to four.

Each of the auxiliary positioning components 17 includes eight auxiliary thru-holes 171 and four positioning structures 172, each of the auxiliary thru-holes 171 penetrates through the corresponding one of the auxiliary positioning components 17, and each of the positioning structures 172 penetrates through the corresponding one of the auxiliary positioning components 17. The four positioning structures 172 of each of the auxiliary positioning components 17 are configured to be fixed to one of the substrates 12 in cooperation with four screws. The present disclosure does not limit the quantity of the auxiliary thru-holes 171, the structure of the auxiliary thru-holes 171, the quantity of the positioning structures 172, and the structure of each of the positioning structures 172 in each of the auxiliary positioning components 17. Naturally, each of the substrates 12 has a plurality of screw holes corresponding to the positioning structures 172.

Each of the chip testing sockets 13 is fixed to the one side of the substrates 12 through the auxiliary positioning component 17, and each of the chip testing sockets 13 and the substrates 12 are not fixed in other manners. In other words, when each of the auxiliary positioning components 17 is detached and each of the auxiliary positioning components 17 is no longer fixed to the substrate 12, each of the chip testing sockets 13 is no longer fixed to the substrate 12, and relevant personnel or machine apparatus can directly take off the chip testing sockets 13 from the substrates 12. In this way, relevant personnel or apparatus can conveniently replace or mount the chip testing sockets 13.

When each of the chip testing sockets 13 is fixed to the one side of the substrates 12 through the auxiliary positioning components 17, a connection portion 131 of each of the chip testing sockets 13 is correspondingly arranged in one of the auxiliary thru-holes 171, and a plurality of pins of the chips C under test are electrically connected to the related electrical connection structure of the substrate 12 through a plurality of probes in the connection portion 131.

In a preferable embodiment, each of the substrates 12 can further include two first auxiliary retaining structures 121, each of the auxiliary positioning components 17 can include two second auxiliary retaining structures 173, and each of the first auxiliary retaining structures 121 can be engaged with one of the second auxiliary retaining structures 173. When mounting one of the auxiliary positioning components 17, relevant personnel or apparatus can allow the second auxiliary retaining structures 173 to be engaged with the first auxiliary retaining structures 121, so that the auxiliary positioning component 17 and the chip testing sockets 13 are disposed on a correct position on the substrate 12, and then relevant personnel or apparatus can further fix the auxiliary positioning component 17 and the chip testing sockets 13 on the one side of the substrate 12 by using a plurality of screws that penetrate through the positioning structures 172 of the positioning component 17. In the present embodiment, each of the first auxiliary retaining structures 121 is a concave hole, each of the second auxiliary retaining structures 173 is a convex column, but the quantity, configuration, structure, and dimensions of the first auxiliary retaining structures 121 and the second auxiliary retaining structures 173 can be changed according to practical requirements and are not limited to those shown in the figures of the present disclosure.

In addition, each of the chip testing sockets 13 can further include three first positioning structures 132, each of the auxiliary positioning components 17 can include a plurality of second positioning structures 174, and each of the first positioning structures 132 is configured to be engaged with one of the second positioning structures 174. When the auxiliary positioning components 17 are disposed on the one side of the substrates 12, each of the first positioning structures 132 and the corresponding one of the second positioning structures 174 are engaged with each other. In this way, in a process where relevant personnel or apparatus fixes the auxiliary positioning structures 17 on the substrates 12 by using screws, each of the chip testing sockets 13 does not easily move relative to the substrates 12 or the auxiliary positioning components 17. In the present embodiment, each of the first positioning structures 132 is a thru-hole penetrating through one of the chip testing sockets 13, and each of the second positioning structures 174 is a convex column, but the specific configuration and the quantity of the first positioning structures 132 and the second positioning structures 174 are not limited to those shown in the figures of the present disclosures.

Referring to FIG. 1, FIG. 2, and FIG. 7 to FIG. 10, the chip carrying sleeve 2 is configured to carry thirty-two chips C under test, and the chip carrying sleeve 2 carrying the thirty-two chips C under test is disposed between the chip testing machine 1 and the temperature adjusting devices 3. The quantity of the chips C under test carried by the chip carrying sleeve 2 is not limited to thirty-two and can be increased or decreased according to practical requirements. In an embodiment of the present disclosure, the chip testing apparatus 100 does not include the chip carrying sleeve 2, and each of the chips C under test can be directly mounted on the corresponding one of the chip testing sockets 13.

Further, the chip carrying sleeve 2 can include a carrying frame 21 and thirty-two chip carrying components 22. The carrying frame 21 includes thirty-two carrying thru-holes 211 and sixty-four first engaging structures 212, each of the carrying thru-holes 211 penetrates through the carrying frame 21, and each of the carrying thru-holes 211 has two of the first engaging structures 212 therein. In the figures of the present disclosure, the two first engaging structures 212 are arranged at two diagonal positions in each of the carrying thru-holes 211, but the quantity of the first engaging structures 212 disposed in each of the carrying thru-holes 211 is not limited to two.

Each of the chip carrying components 22 includes a chip accommodating slot 221, two second engaging structures 222, and four chip retaining structures 223. In each of the chip carrying components 22, the chip accommodating slot 221 penetrates through the chip carrying component 22, the two second engaging structures 222 are formed at one side of the chip carrying component 22, and the four chip retaining structures 223 protrude from the chip accommodating slot 221. Each of the chip accommodating slots 221 is configured to accommodate one of the chips C under test, and when the one of the chips C under test is disposed in one of the chip accommodating slots 221, the chip C under test is retained by the four chip retaining structures 223, and the chip C under test cannot pass through the four chip retaining structures 223 and exit the chip accommodating slot 221. Each of the chip carrying components 22 is disposed in one of the carrying thru-holes 211, the two second engaging structures 222 and the two first engaging structures 212 are engaged with each other, and the first engaging structures 212 and the second engaging structures 222 engaged with each other can retain a movement range of the chip carrying component 22 relative to the carrying frame 21.

In the figures of the present embodiment, each of the first engaging structures 212 includes a circular thru-hole, and each of the second engaging structures 222 is in a barrel shape, but the structure of each of the first engaging structures 212 and the structure of each of the second engaging structures 222 are not limited thereto.

In a practical application, the chip carrying sleeve 2 can be transferred among different apparatuses through a related robotic arm. For example, the related robotic arm can move the chip carrying sleeve 2 and place the chip carrying sleeve 2 on a chip placement apparatus, and the chip placement apparatus can place the chips C under test into the chip accommodating slots 221 of the chip carrying sleeve 2. Afterwards, the related robotic arm can move the chip carrying sleeve 2 carrying the chips C under test to one side of the hollow frame 16 of the chip testing apparatus 100 of the present disclosure.

Referring to FIG. 4, each of the auxiliary positioning components 17 can include a main body 175, a plurality of first abutting portions 176 and a plurality of first retaining structures 177. The main body 175 has a plurality of auxiliary thru-holes 171, each of the auxiliary thru-holes 171 penetrates through the main body 175, the first abutting portions 176 are formed on one side of the main body 175, and at least two sides of each of the auxiliary thru-holes 171 are adjacent to one of the first abutting portions 176. Each of the first retaining structures 177 is disposed on one side of the corresponding one of the first abutting portions 176 away from the main body 175. The main body 175, the first abutting portions 176, and the first retaining structures 177 can be formed in a one-piece structure. At least two of the first retaining structures 177 can be disposed at an outer periphery of each of the auxiliary thru-holes 171, and two of the first retaining structures 177 adjacent to the same one of the auxiliary thru-holes 171 can be diagonally disposed. Each of the first retaining structures 177 can be, for example, in a column shape, but the structure of each of the first retaining structures 177 is not limited thereto.

Figure 8:
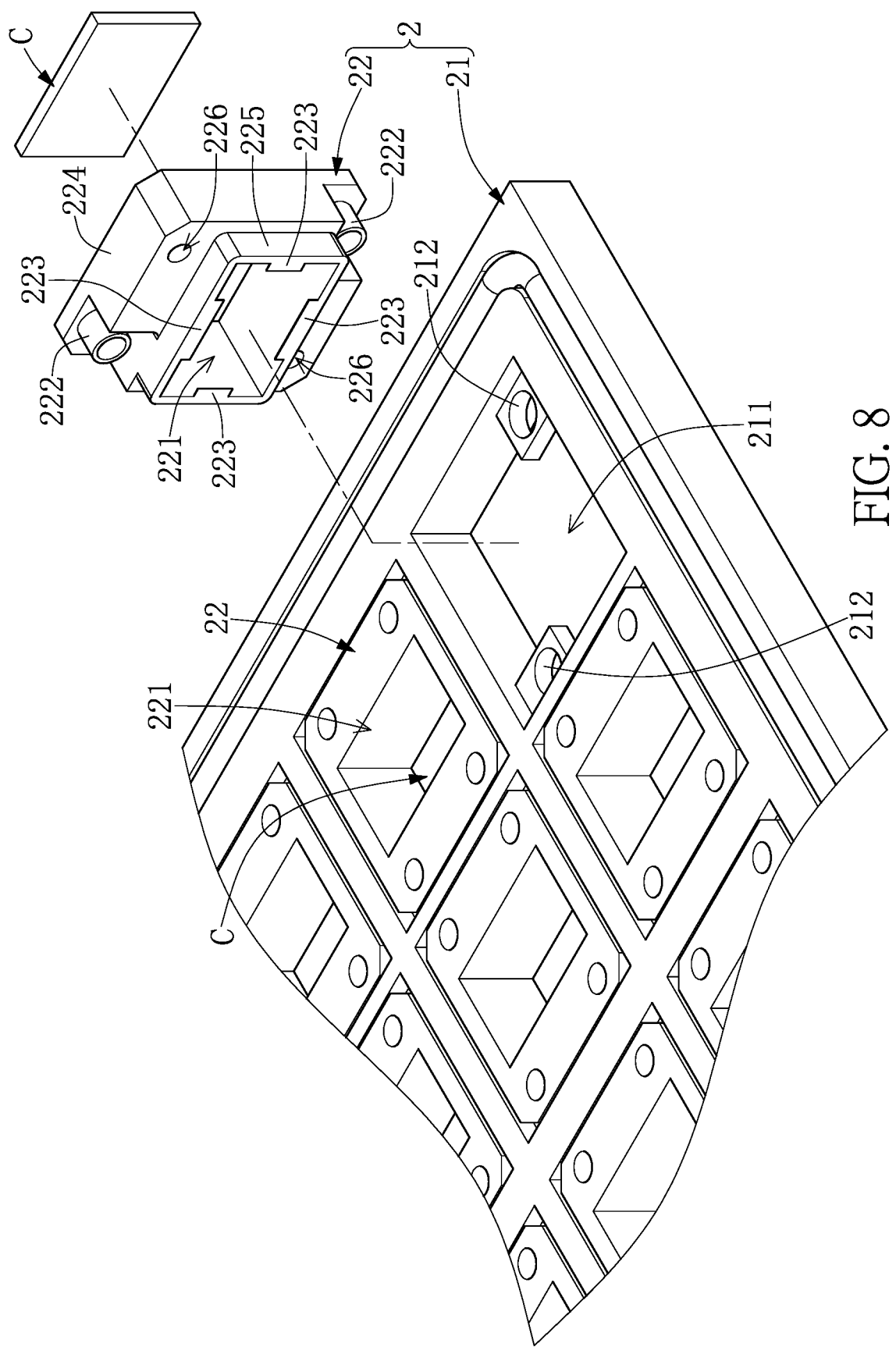
FIG. 8 is a partial exploded view of the chip carrying sleeve of the chip testing apparatus of the present disclosure.
Figure 9:
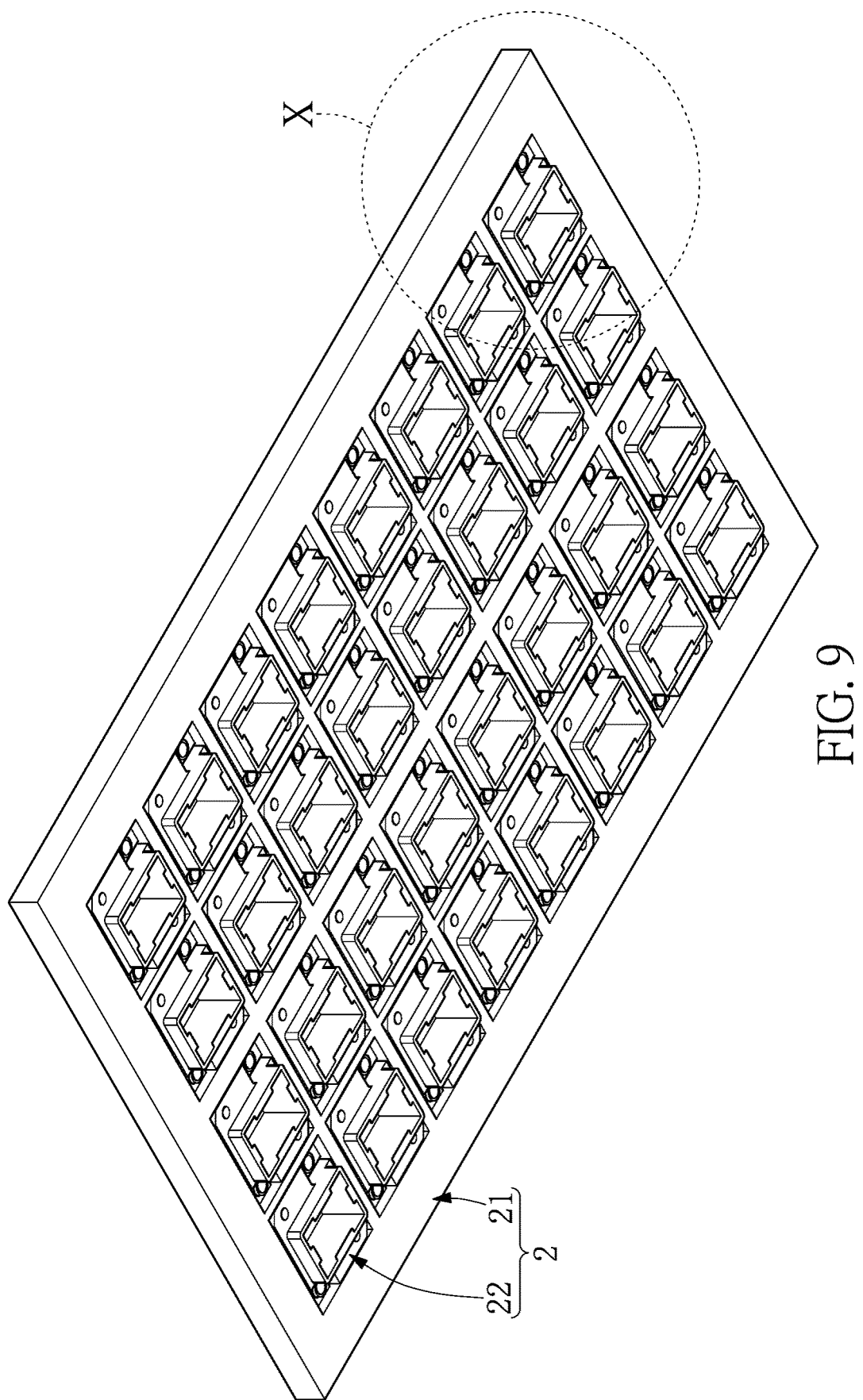
FIG. 9 is a schematic view from another angle of the chip carrying sleeve of the chip testing apparatus of the present disclosure.
Figure 10:
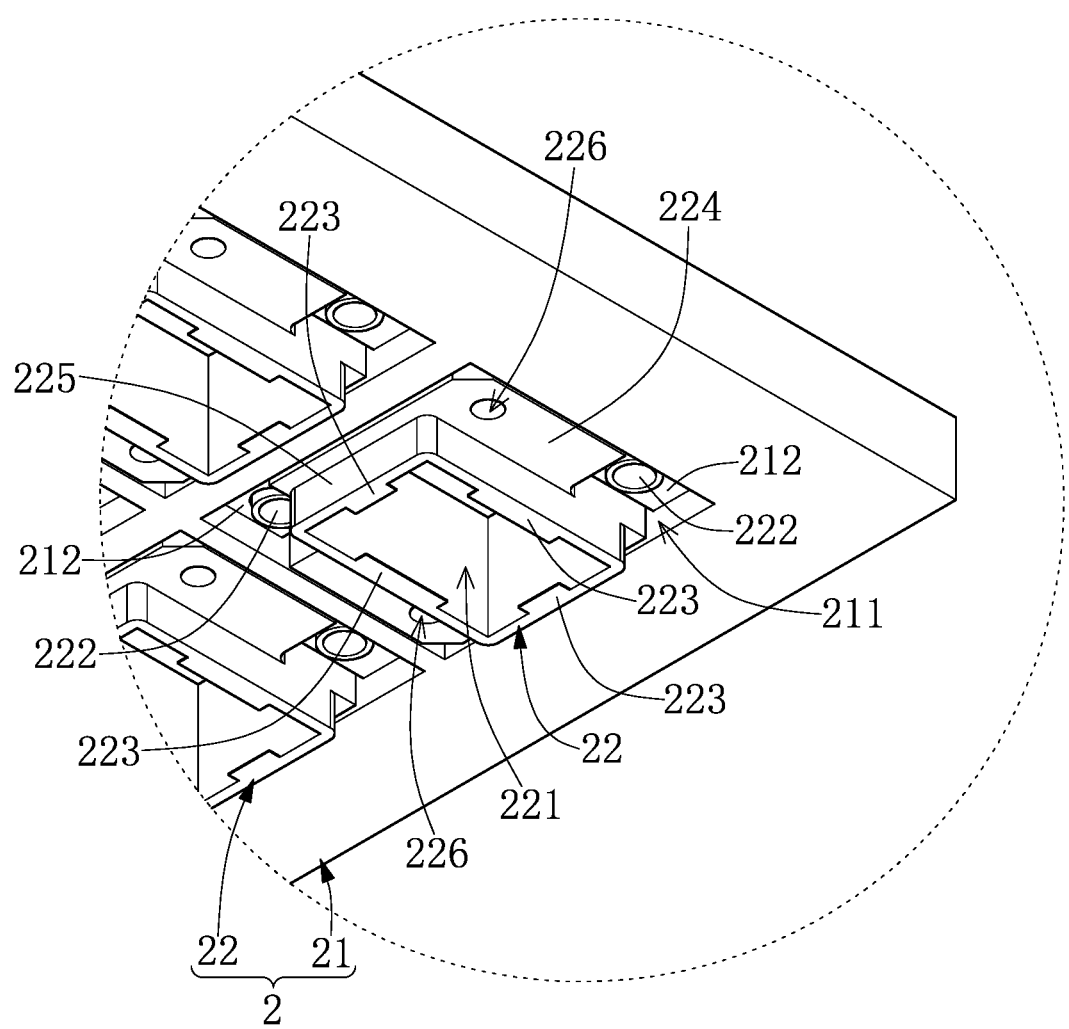
FIG. 10 is a partial enlarged view of FIG. 9.
Figure 11:
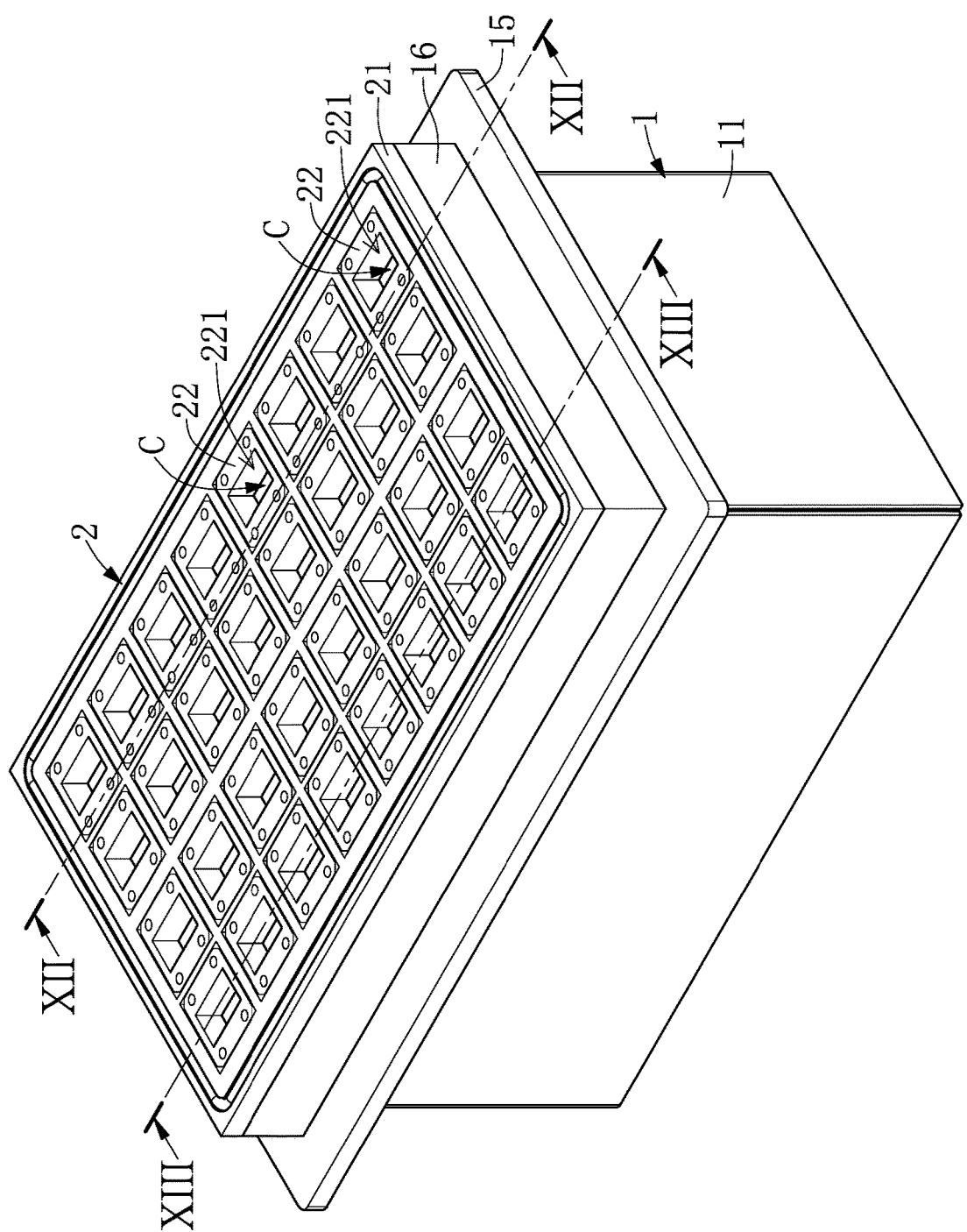
FIG. 11 is a schematic view of the chip testing machine having the chip carrying sleeve disposed thereon of the chip testing apparatus of the present disclosure.

Referring to FIG. 8, each of the chip carrying components 22 can include a second abutting portion 224, an entering portion 225, and two second retaining structures 226. The two second engaging structures 222 are formed on the second abutting portion 224, an outer diameter of the entering portion 225 is less than an outer diameter of the second abutting portion 224, and the four chip retaining structures 223 include the entering portion 225. In each of the chip carrying components 22, the two second retaining structures 226 are formed on the second abutting portion 224, and each of the second retaining structures 226 can be a concave hole or a thru-hole that penetrates through the second abutting portion 224.

Each of the second retaining structures 226 is configured to be engaged with one of the first retaining structures 177, and when the chip carrying sleeve 2 is disposed on the one side of the hollow frame 16, the two second retaining structures 226 of each of the chip carrying components 22 are sleeved around two of the first retaining structures 177 of the auxiliary positioning components 17. In this way, the chip accommodating slot 221 of each of the chip carrying components 22 can be correctly aligned with one of the auxiliary thru-holes 171.

Figure 12:
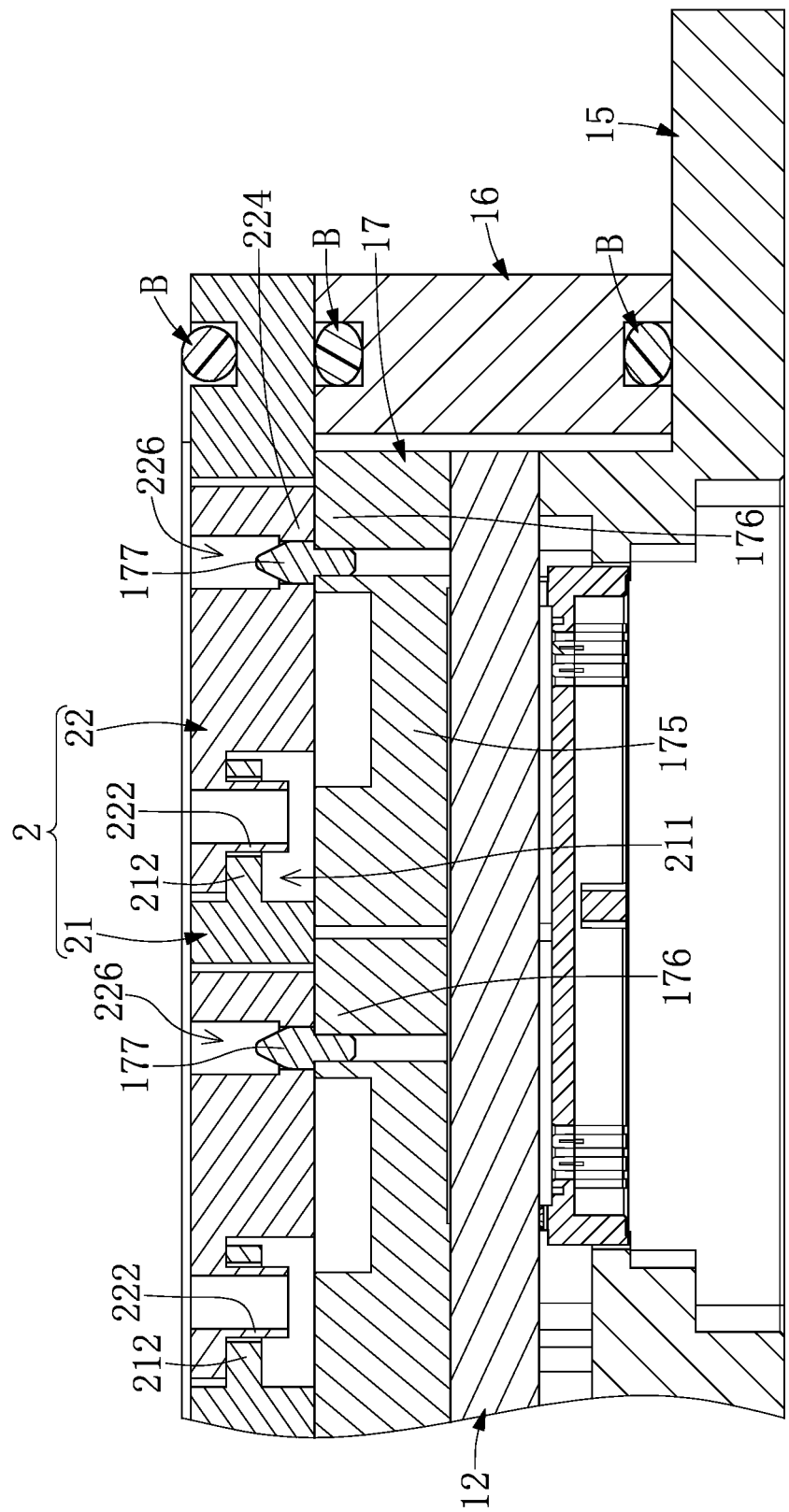
FIG. 12 is a cross-sectional view taken along line XII-XII in FIG. 11.
Figure 13:
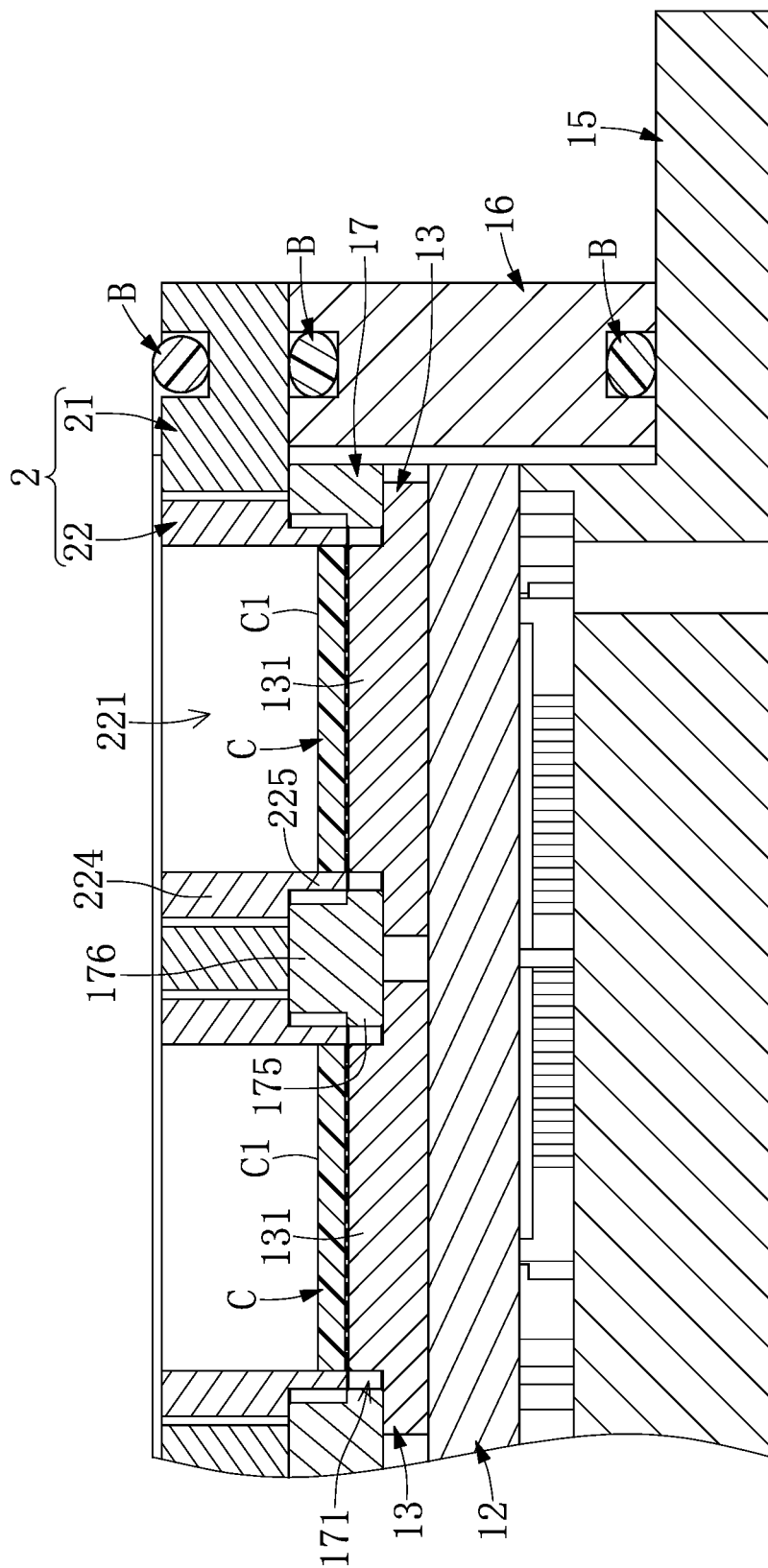
FIG. 13 is a cross-sectional view taken along line XIII-XIII in FIG. 11.
Figure 14:
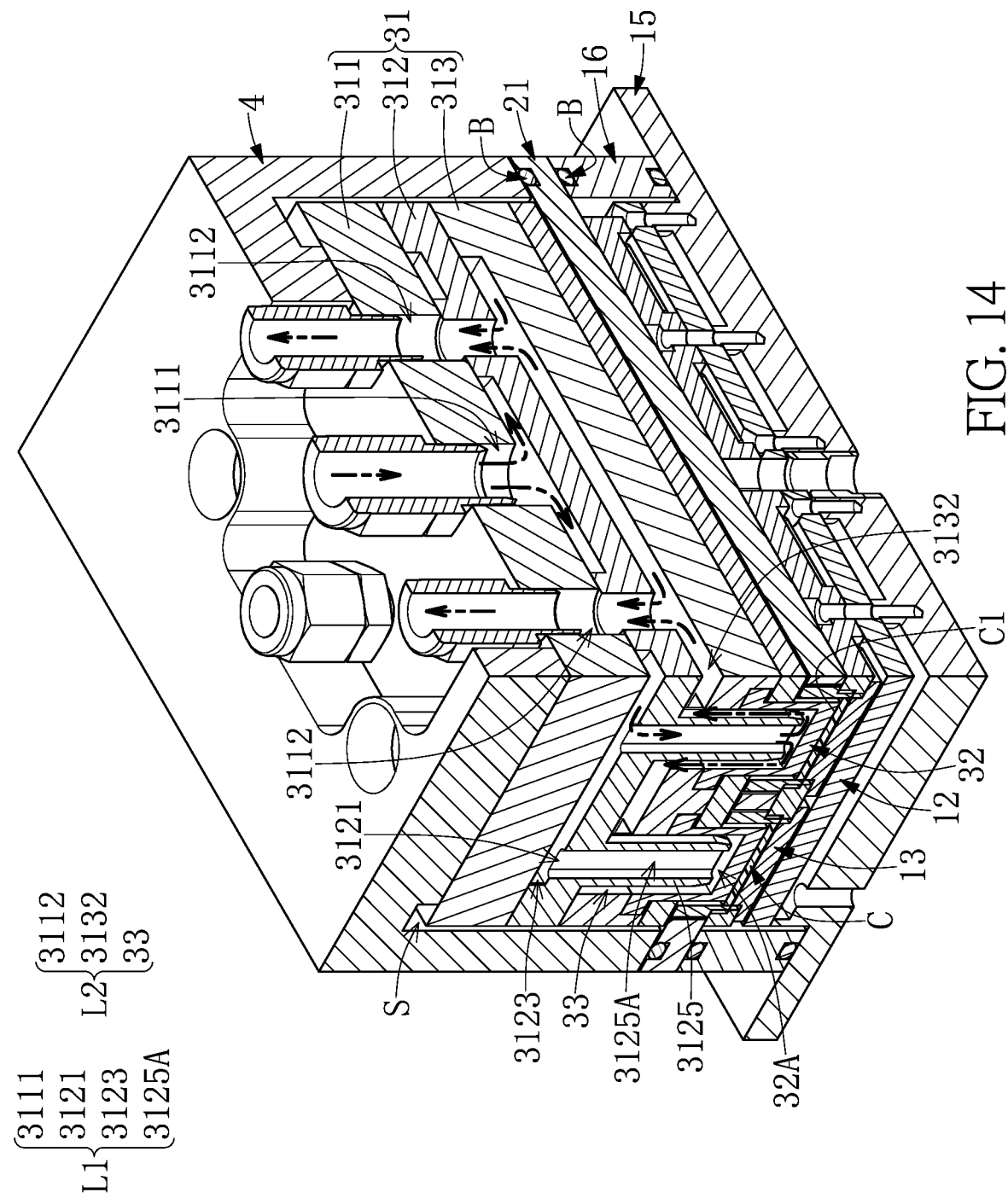
FIG. 14 is a partial sectional view of the chip testing apparatus of the present disclosure.
Figure 15:
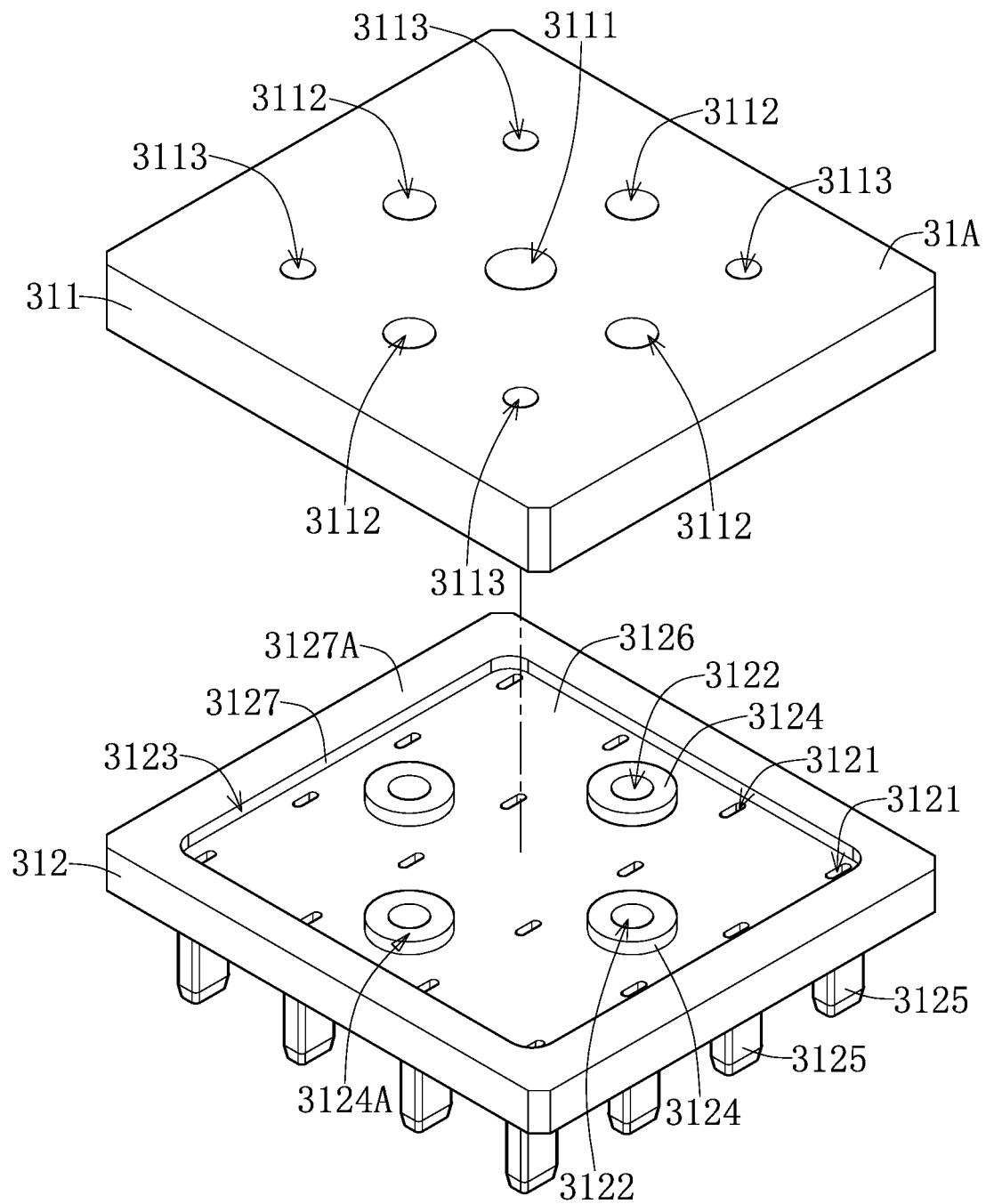
FIG. 15 to FIG. 18 are exploded views from different angles of the temperature adjusting device of the present disclosure.
Figure 16:
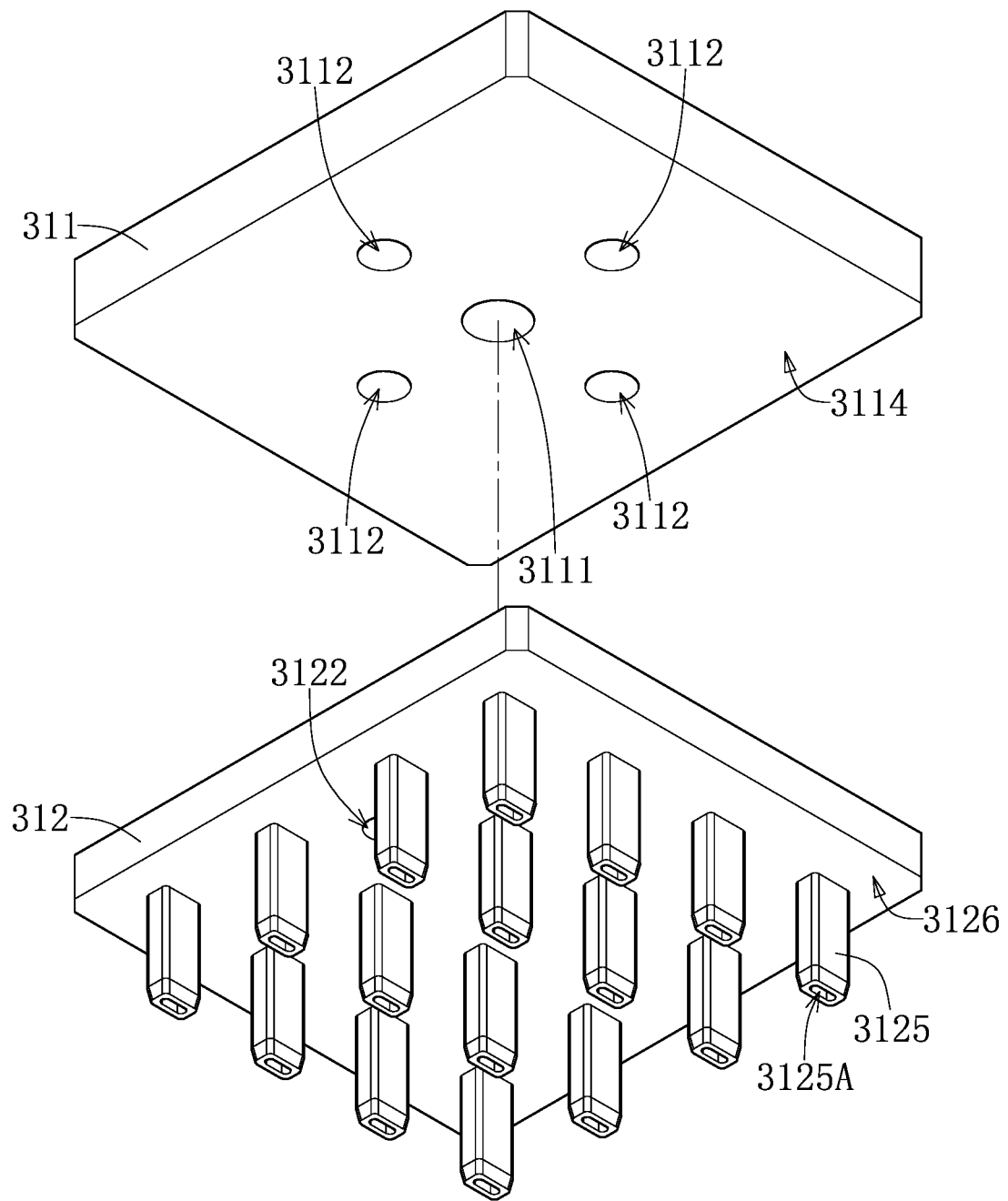
Figure 17:
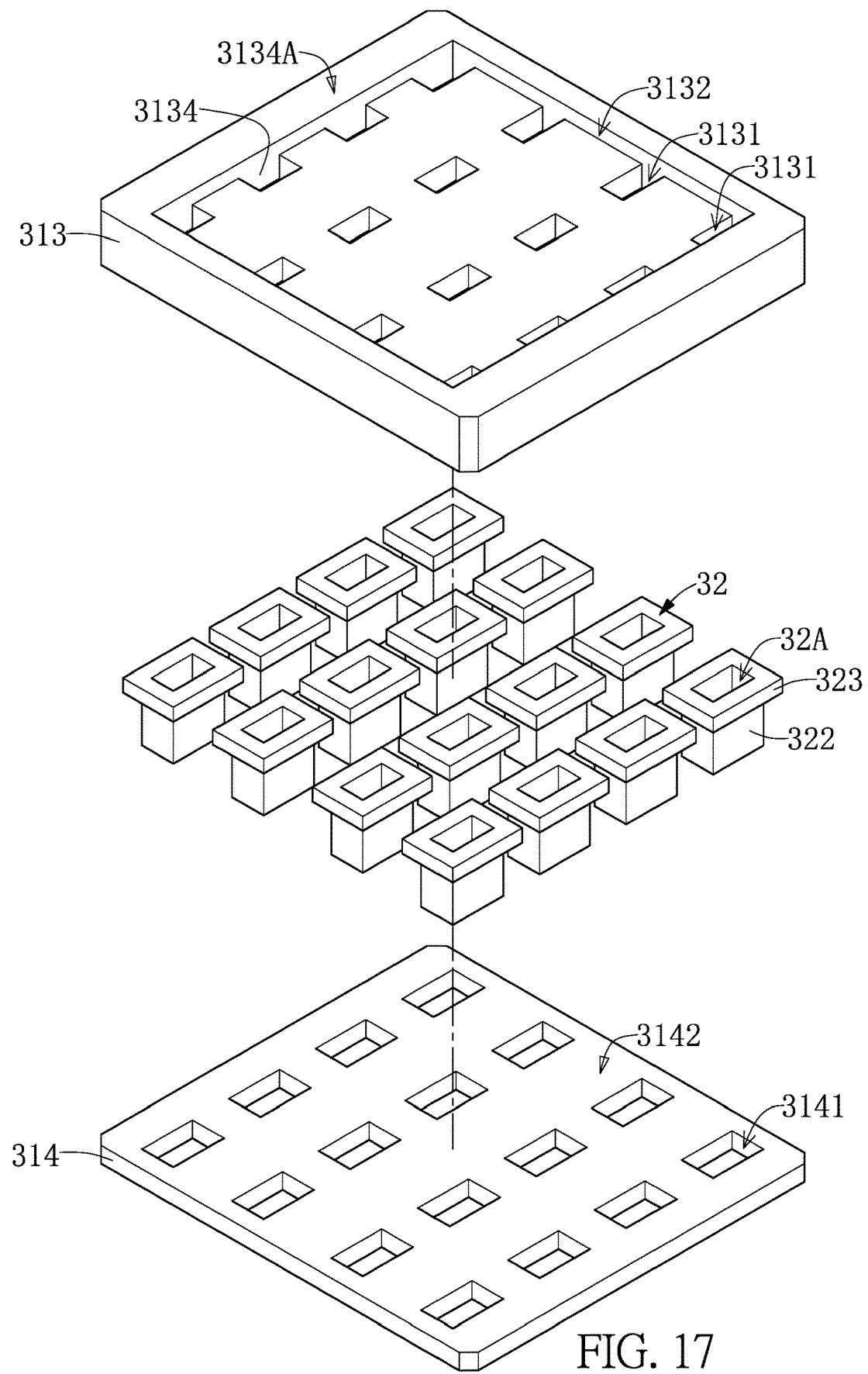
Figure 18:
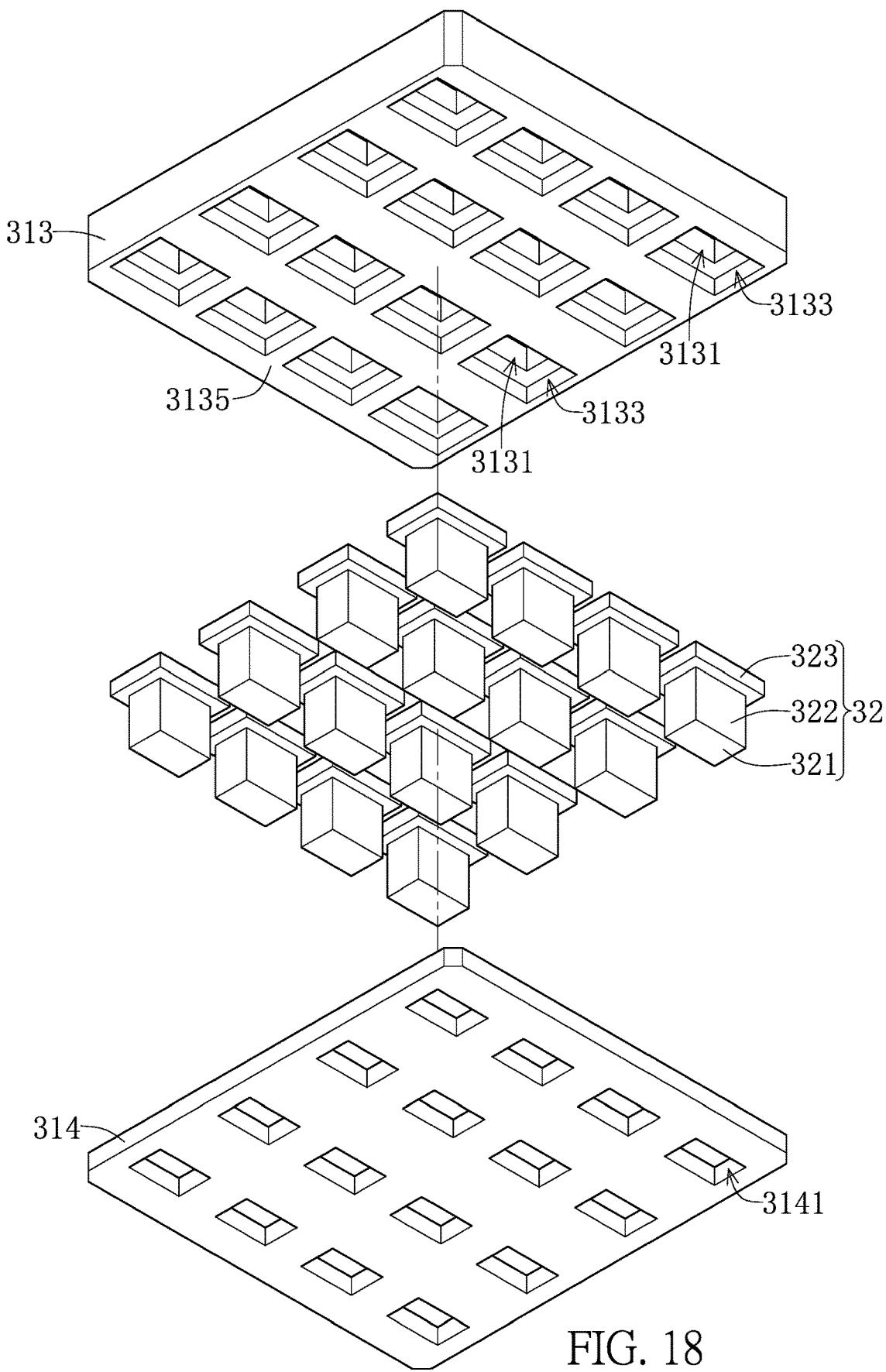

Referring to FIG. 12 and FIG. 13, when the chip carrying sleeve 2 is disposed on the one side of the hollow frame 16, the carrying frame 21 abuts against the one side of the hollow frame 16, and each of the second abutting portions 224 correspondingly abuts against one of the first abutting portions 176. Each of the entering portions 225 is correspondingly arranged between the two first abutting portions 176, each of the entering portions 225 faces toward one of the auxiliary thru-holes 171, and the chip C under test that is arranged in the chip accommodating slot 221 correspondingly faces toward the chip testing socket 13 in the auxiliary thru-hole 171.

Referring to FIG. 1 to FIG. 3, FIG. 13, and FIG. 14, the lid 4 covers the two temperature adjusting devices 3. The lid 4 can have two thru-holes 41, each of the thru-holes 41 penetrates through the lid 4, each of the thru-holes 41 is configured to be connected to a tube connector A, and the air suction apparatus can be connected to the two tube connectors A on the two thru-holes 41 of the lid 4 through two tubes. Each of the tube connectors A can be, for example, various types of quick connectors. The quantity and the arrangement position of the thru-holes 41 included by the lid 4 are not limited to those shown in the figures of the present disclosure.

In a practical application, the chip carrying sleeve 2 can abut against one side of the chip testing machine 1, the temperature adjusting devices 3 covered by the lid 4 abut against one side of the chip carrying sleeve 2 away from the chip testing machine 1, and an enclosed space S is defined among the lid 4, the chip carrying sleeve 2, and the chip testing machine 1. The air suction apparatus is configured to suction away air in the enclosed space S, so that the enclosed space S is in a state of negative pressure. In an embodiment of the present disclosure, the chip testing apparatus 100 does not include the chip carrying sleeve 2, the lid 4 can abut against the substrates 12, and the lid 4 and the substrates 12 can jointly define the enclosed space S.

In a practical application, when the chip carrying sleeve 2 carrying the chips C under test is disposed on the one side of the hollow frame 16, each of the chips C under test in the corresponding one of the chip accommodating slots 221 can be already electrically connected to the adjacent one of the chip testing sockets 13. In other words, the pins of the chips C under test can be already connected to the probes of the chip testing sockets 13, but the present disclosure is not limited thereto. In other embodiments, the pins of the chips C under test in the chip accommodating slots 221 can be connected to the probes of the adjacent chip testing sockets 13 when the air suction apparatus starts to be operated.

When the air suction apparatus suctions away air in the enclosed space S, and the enclosed space S is accordingly in the negative pressure state, the pins of each of the chips C under test are tightly in contact with the probes of the adjacent one of the chip testing sockets 13, and the testing module 14 can perform a testing operation to the chips C under test through the chip testing sockets 13.

In a practical application, three annular enclosed members B can be respectively disposed between the hollow frame 16 and the bottom board 15, between the hollow frame 16 and the chip carrying sleeve 2, and between the chip carrying sleeve 2 and the lid 4. When the air suction apparatus suctions away air in the enclosed space S, each of the annular enclosed members B can allow the enclosed space S to be maintained in an enclosed state relative to the external environment.

It should be noted that, since each of the probes included by the chip testing sockets 13 has an elastic member (e.g., normally, a compressed spring), if the pins of the chips C under test carried by the chip carrying sleeve 2 are required to be directly in contact with the probes of the adjacent chip testing sockets 13, a strong force implemented on the chip carrying sleeve 2 or the lid 4 is necessary, so that the pins of the chips C under test can be in contact with the probes of the adjacent chip testing sockets 13. In contrast, through the cooperation of related components such as the air suction apparatus and the lid 4, the enclosed space S can be in the negative pressure state, and the pins of the chips C under test can be easily in contact with the probes of the adjacent chip testing sockets 13

Referring to FIG. 2, FIG. 3, and FIG. 14 to FIG. 18, each of the temperature adjusting devices 3 includes a main body 31 and sixteen pressing components 32. The quantity of the pressing components 32 included by each of the temperature adjusting devices 3 can be changed according to practical requirements and is not limited to that shown in the figures of the present disclosure.

The main body 31 internally includes a first fluid channel L1 (described in detail below) and a second fluid channel L2 (described in detail below). Two wide surfaces of the main body 31 opposite to each other are respectively defined as a first wide surface 31A and a second wide surface 31B. The main body 31 has a first main body thru-hole 3111 and a four second main body thru-holes 3112 on the first wide surface 31A, and the first main body thru-hole 3111 is not in spatial communication with the second main body thru-holes 3112. The first main body thru-hole 3111 is in spatial communication with the first fluid channel L1, and the second main body thru-holes 3112 are in spatial communication with the second fluid channel L2.

The quantity of the first main body thru-hole 3111 and the quantity of the second main body thru-holes 3112 included by the main body 31 are not limited to those shown in the figures of the present disclosure. In the present embodiment, the first main body thru-hole 3111 and all of the second main body thru-holes are arranged on the first wide surface 31A of the main body 31, but the first main body thru-hole 3111 and the second main body thru-holes 3112 are not limited to be arranged on the same wide surface of the main body 31.

One portion of each of the pressing components 32 protrudes from the second wide surface 31B of the main body 31, each of the pressing components 32 includes a fluid accommodating slot 32A therein that is in spatial communication with the first fluid channel L1 and the second fluid channel L2. Excluding the portion of the first fluid channel L1 connected to the fluid accommodating slots 32A, other portions of the first fluid channel L1 are not in spatial communication with the second fluid channel L2. Each of the pressing components 32 includes a wall portion 321, the wall portion 321 has an abutting surface 3211, and the wall portion 321 is an end wall forming the fluid accommodating slot 32A.

The first main body thru-hole 3111 is provided so that a fluid having a predetermined temperature flows into the main body 31, the fluid entering into the main body 31 from the first main body thru-hole 3111 is configured to be guided by the first fluid channel L1 to flow into each of the fluid accommodating slots 32A, and the fluid in each of the fluid accommodating slots 32A is configured to enter into the second fluid channel L2, flow along the second fluid channel L2, and exit the main body 31 from each of the second main body thru-holes 3112.

When each of the temperature adjusting devices 3 is fixed on the chip testing machine 1, one portion of each of the pressing components 32 is correspondingly arranged in one of the chip accommodating slots 221, the pressing surface 3211 of each of the pressing components 32 is disposed on a surface C1 of one of the chips C under test on one of the chip testing sockets 13, and the fluid flowing in the each of the fluid accommodating slots 32A is configured to exchange heat through the wall portions 321. In a practical application, when the air suction apparatus is not operated, a gap is between the pressing surface 3211 of each of the pressing components 32 and the surface C1 of the adjacent one of the chips C under test. When the air suction apparatus is operated, the enclosed space S is in the negative pressure state, and the pressing surface 3211 of each of the pressing components 32 can be tightly closed to the surface C1 of the adjacent one of the chips C under test. Naturally, in other embodiments, when the air suction apparatus is not operated, the pressing surface 3211 of each of the pressing components 32 can abut against the surface C1 of the adjacent one of the chips C under test.

In a practical application, when each of the temperature adjusting devices 3 is disposed on the chip testing machine 1, a related processing device can control the air suction apparatus to be operated, so that the enclosed space S is in the negative pressure state, and the related processing device can then allow the fluid having the predetermined temperature to flow into the main body 31 through the first main body thru-hole 3111 and enter into each of the fluid accommodating slots 32A, so that each of the chips C under test is arranged in an environment having the predetermined temperature. Afterwards, the related processing device can control the testing module 14 to perform the testing operation to each of the chips C under test on the corresponding one of the chip testing sockets 13. In this way, each of the chips C under test can undergo the testing operation in the environment having the predetermined temperature. When each of the chips C under test is tested by the testing module 14, the fluid having the predetermined temperature continuously flows into the main body 13, so that each of the chips C under test is continuously maintained in the environment having the predetermined temperature. The fluid in each of the fluid accommodating slots 32A flows along the second fluid channel L2 and is discharged out from the four second main body thru-holes 3112, and a temperature of the fluid in each of the fluid accommodating slots 32A is continuously maintained at the predetermined temperature.

Referring to FIG. 3 and FIG. 14 to FIG. 18, in a practical application, the main body 31 of each of the temperature adjusting devices 3 can include a first component 311, a second component 312, a third component 313, and a supporting component 314. The first component 311, the second component 312, the third component 313, and the supporting component 314 are connected to each other, the second component 312 is disposed between the first component 311 and the third component 313, and the third component 313 is disposed between the second component 312 and the supporting component 314. The connecting manner of the first component 311, the second component 312, the third component 313, and the supporting component 314 can be changed according to practical requirements, and the present disclosure is not limited thereto. For example, the first component 311, the second component 312, the third component 313, and the supporting component 314 can be fixed with each other in an adhering manner through glue or in a screwing manner through screws. Naturally, if the first component 311, the second component 312, the third component 313, and the supporting component 314 are fixed through related components such as screws, the related components do not penetrate into a first temporary storage slot 3123, a second temporary storage slot 3132, or the fluid accommodating slots 32A. In a special application, the first component 311, the second component 312, the third component 313, and the supporting component 314 can be formed in a one-piece structure. For example, the first component 311, the second component 312, the third component 313, and the supporting component 314 can be made in a 3D printing manner.

Referring to FIG. 3, FIG. 15, FIG. 16, FIG. 19, and FIG. 20, each of the first components 311 can include the first main body thru-hole 3111, the four second main body thru-holes 3112, and four screw holes 3113. The first main body thru-hole 3111 and the second main body thru-holes 3112 penetrate through the first component 311. The first main body thru-hole 3111 can be substantially arranged at a center position of the first component 311, and the four second main body thru-holes 3112 are substantially disposed at an outer periphery of the first main body thru-hole 3111. The arrangement positions, structures, quantities of the first main body thru-hole 3111 and the second main body thru-holes 3112 are not limited to those shown in the figures of the present disclosure and can be changed according to requirements such as the dimensions and the structure of the first component 311.

Each of the screw holes 3113 is a blind hole that does not penetrate through the first component 311. The lid 4 can have eight penetrating holes 42, and eight screws can be screwed with the eight screw holes 3113 included by the two first components 311 of the two temperature adjusting devices 3 through the eight penetrating holes 42 of the lid 4, so that the lid 4 and the two first components 311 of the two temperature adjusting devices 3 can be fixed with each other. The quantity and the arrangement position of the screw holes 3113 included by each of the first components 311 can be changed according to practical requirements and are not limited to those shown in the figures of the present disclosure.

Each of the second components 312 includes sixteen first component thru-holes 3121, four connection thru-holes 3122, the first temporary storage slot 3123, four annular supporting structures 3124, and sixteen guiding structures 3125. Each of the first component thru-holes 3121 penetrates through the second component 312, each of the connection thru-holes 3122 penetrates through the second component 312, the first temporary storage slot 3123 is recessed from one side of the second component 312, and each of the first component thru-holes 3121 is arranged in the first temporary storage slot 3123. The four annular supporting structures 3124 are arranged in the first temporary storage slot 3123, the four annular supporting structures 3124 can protrude from a bottom surface 3126 of the first temporary storage slot 3123, a height of each of the annular supporting structures 3124 is substantially equal to a depth of the first temporary storage slot 3123, and each of the annular supporting structures 3124 surrounds one of the connection thru-holes 3122.

Each of the guiding structures 3125 is disposed on another side of the second component 312 away from the first temporary storage slot 3123, and each of the guiding structures 3125 can be substantially in a hollow rectangular shape, each of the guiding structures 3125 has a first guiding passage 3125A formed therein. Each of the first guiding passages 3125A is in spatial communication with one of the first component thru-holes 3121, and each of the first guiding passages 3125A is in spatial communication with the first temporary storage slot 3123. The fluid arranged in the first temporary storage slot 3123 can flow into the first guiding passage 3125A of each of the pressing components 32 through each of the first component thru-holes 3121, and the fluid arranged in the first temporary storage slot 3123 is blocked by each of the annular supporting structures 3124, so that the fluid does not flow into the connection thru-holes 3122.

The arrangement positions of the four annular supporting structures 3124 correspond to the four second main body thru-holes 3112 of the first component 311. When the first component 311 is fixed to the one side of the second component 312 having the first temporary storage slot 3123, a bottom surface 3114 of the first component 311 tightly abuts against an end surface 3124A of the four annular supporting structures 3124, and the bottom surface 3114 of the first component 311 tightly abuts against an end surface 3127A of an annular side wall 3127 of the second component 312 having the first temporary storage slot 3123. The four second main body thru-holes 3112 are correspondingly in spatial with the four connection thru-holes 3122, each of the second main body thru-holes 3112 is blocked by the corresponding one of the annular supporting structures 3124 and are not in spatial communication with the first temporary storage slot 3123, and the first main body thru-hole 3111 is in spatial communication with the first temporary slot 3123.

According to the above, the first component 311 is fixed to the one side of the second component 312, when the fluid enters from a first fluid thru-hole 41, the fluid enters into the first temporary storage slot 3123 from the first main body thru-hole 3111, the fluid flows in the first temporary storage slot 3123, and the fluid is guided by the sixteen first component thru-holes 3121 and flows into the first guiding passages 3125A in the sixteen guiding structures 3125. The fluid flowing in the first temporary storage slot 3123 is blocked by each of the annular supporting structures 3124 and does not flow into the connection thru-hole 3122.

Referring to FIG. 17 to FIG. 19 and FIG. 21, the third component 313 includes sixteen second component thru-holes 3131 and the second temporary storage slot 3132. Each of the second component thru-holes 3131 penetrates through the third component 313, the second temporary storage slot 3132 is recessed from one side of the third component 313, each of the second component thru-holes 3131 is arranged in the second temporary storage slot 3132, and each of the second component thru-holes 3131 is in spatial communication with the second temporary storage slot 3132. The sixteen second component thru-holes 3131 correspond to the sixteen guiding structures 3125, a diameter of each of the second component thru-holes 3131 is greater than an outer diameter of each of the guiding structures 3125, and each of the second component thru-holes 3131 can be penetrated by the corresponding one of the guiding structures 3125. The quantity of the second component thru-holes 3131 included by the third component 313 corresponds to the quantity of the guiding structures 3125 included by the second component 312, and the structure of each of the second component thru-holes 3131 substantially corresponds to the structure of the corresponding one of the guiding structures 3125.

It is worth mentioning that, a longitudinal length of each of guiding structures 3125 is greater than a thickness of the third component 313, and one portion of each of the guiding structures 3125 penetrating through the corresponding one of the second component thru-holes 3131 is correspondingly arranged at one side of the third component 313 away from the second component 312.

Figure 21:
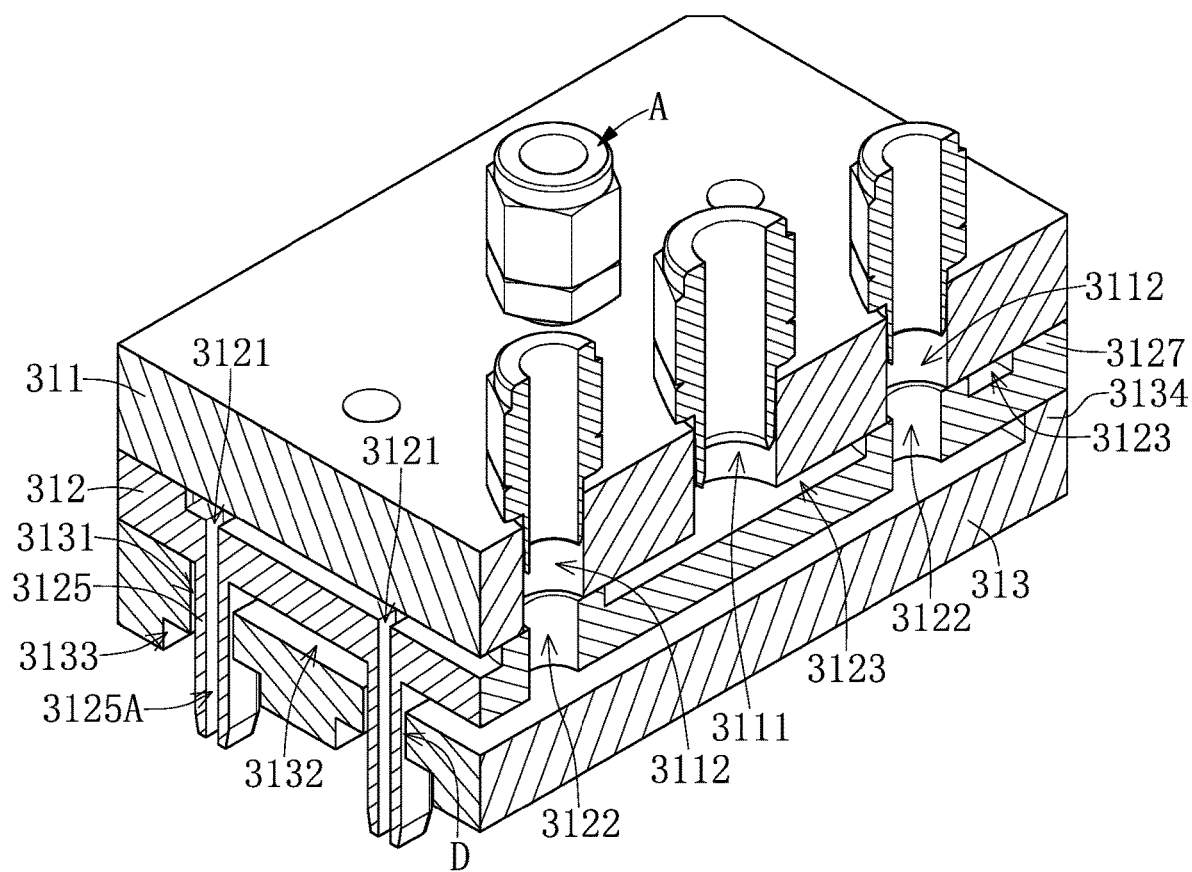
FIG. 21 is a cross-partial sectional view of the first component, the second component, and the third component of the temperature adjusting device of the chip testing apparatus of the present disclosure.

Referring to FIG. 21, when the first component 311 is fixed to the one side of the second component 312 having the first temporary storage slot 3123, and the second component 312 is fixed to the one side of the third component 313 having the second temporary storage slot 3132, each of the guiding structures 3125 correspondingly penetrates through one of the second component thru-holes 3131, and a gap D is defined between each of the guiding structures 3125 and a side wall forming the second component thru-hole 3131. Each of the second main body thru-holes 3112 is in spatial communication with the second temporary storage slot 3132 through the connection thru-hole 3122.

The third component 313 can have sixteen engaging structures 3133 at one side thereof away from the second temporary storage slot 3132, each of the engaging structures 3133 can be a convex slot recessed from the one side of the third component 313, and each of the convex slots is in spatial communication with one of the second component thru-holes 3131. Each of the pressing components 32 can include a pressing portion 322 and an engaging portion 323, the pressing portion 322 has a fluid accommodating slot 32A therein, and the engaging portion 323 is connected to the pressing portion 322. The engaging portion 323 is arranged at one end of the pressing portion 322 away from the wall portion 321, and an outer diameter of the engaging portion 323 is greater than an outer diameter of the pressing portion 322.

The engaging portion 323 of each of the pressing components 32 is engaged with one of the engaging structures 3133, and each of the pressing components 32 is accordingly fixed to one side of the third component 313. The fluid accommodating slot 32A of each of the pressing component 32 is in spatial communication with the adjacent one of the second component thru-holes 3131, and the second temporary storage slot 3132 is in spatial communication with each of the fluid accommodating slots 32A through the corresponding one of the second component thru-holes 3131. In a practical application, a manner in which each of the pressing components 32 is fixed with the third component 313 is not limited to that shown in the figures of the present disclosure.

It is worth mentioning that, in one of the practical applications, the supporting component 314 and the third component 313 can be detachably fixed with each other, and the engaging portion 323 of each of the pressing components 32 and the engaging structure 3133 can be detachably disposed. In this way, relevant personnel can replace the pressing components 32 having different dimensions and structures according to the sorts and types of the chips C under test.

Referring to FIG. 17 to FIG. 19, FIG. 22, and FIG. 23, when the first component 311, the second component 312, and the third component 313 are connected to each other, the second component 312 is disposed on the one side of the third component 313 having the second temporary storage slot 3132, the bottom surface 3126 of the second component 312 tightly abuts against an end surface 3134A of an annular surface 3134 of the third component 313 forming the second temporary storage slot 3132, each of the guiding structures 3125 penetrates through the corresponding one of the second component thru-holes 3131, and one portion of each of the guiding structures 3125 is correspondingly arranged in the fluid accommodating slot 32A. An outer diameter of each of the guiding structures 3125 is less than an outer diameter of the corresponding one of the fluid accommodating slots 32A, and a second guiding passage 33 is defined between each of the guiding structures 3125 in the fluid accommodating slot 32A and a side wall forming the fluid accommodating slot 32A.

Referring to FIG. 17, FIG. 18, FIG. 22, and FIG. 23, the supporting component 314 has a board structure, the supporting component 314 includes sixteen retaining holes 3141, and each of the retaining holes 3141 penetrates through the supporting component 314. The supporting component 314 is fixed to one side of the third component 313 having the sixteen engaging structures 3133, and the pressing portion 322 of each of the pressing components 32 correspondingly penetrates through one of the retaining holes 3141. A diameter of each of the retaining holes 3141 is greater than an outer diameter of the pressing portion 322 of each of the pressing components 32, an outer diameter of the engaging portion 323 of each of the pressing components 32 is greater than a diameter of each of the retaining holes 3141, and when the pressing portion 322 of each of the pressing components 32 penetrates through one of the retaining holes 3141, the engaging portion 323 correspondingly abuts against a wide surface 3142 of the supporting component 314.

When the supporting structure 314 is fixed to the one side of the third component 313, the wide surface 3142 of the supporting component 314 abuts against a wide surface 3135 of the third component 313 having the sixteen engaging structures 3133, and the supporting component 314 is tightly connected to the third component 313.

Figure 22:
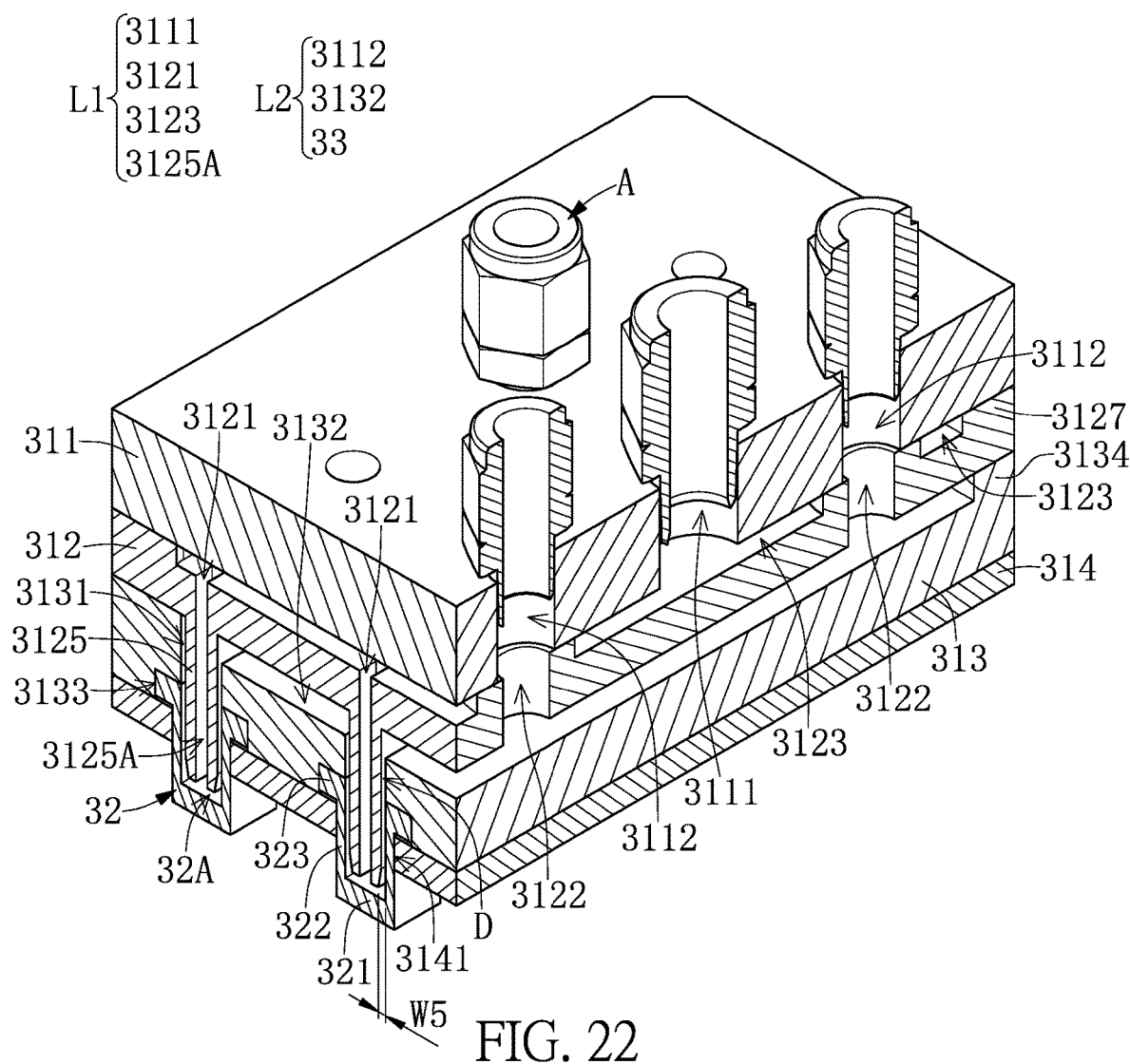
FIG. 22 is a cross-partial sectional view of the temperature adjusting device of the chip testing apparatus of the present disclosure.
Figure 23:
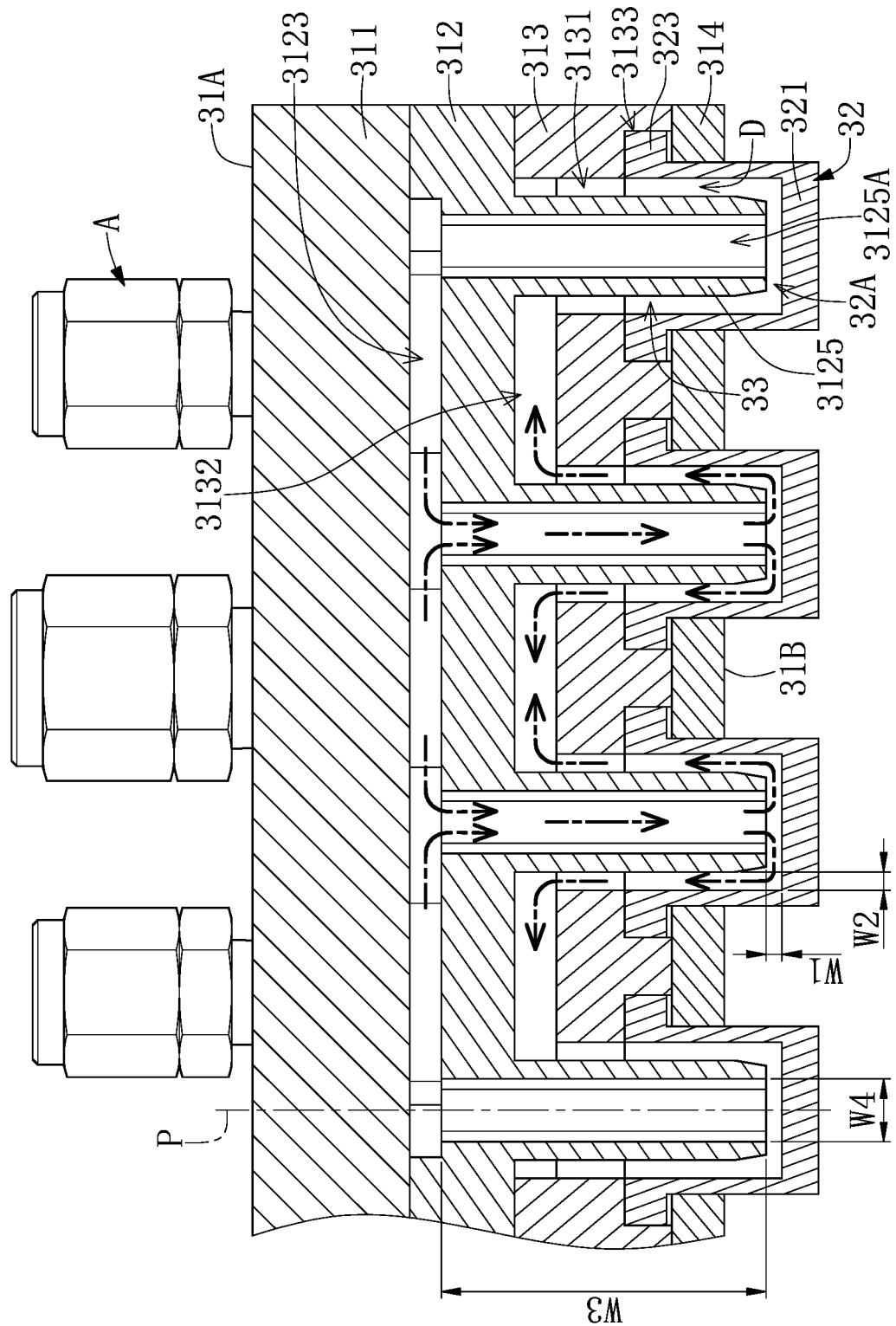
FIG. 23 is a cross-sectional view taken along line XXIII-XXIII in FIG. 2.
Figure 24:
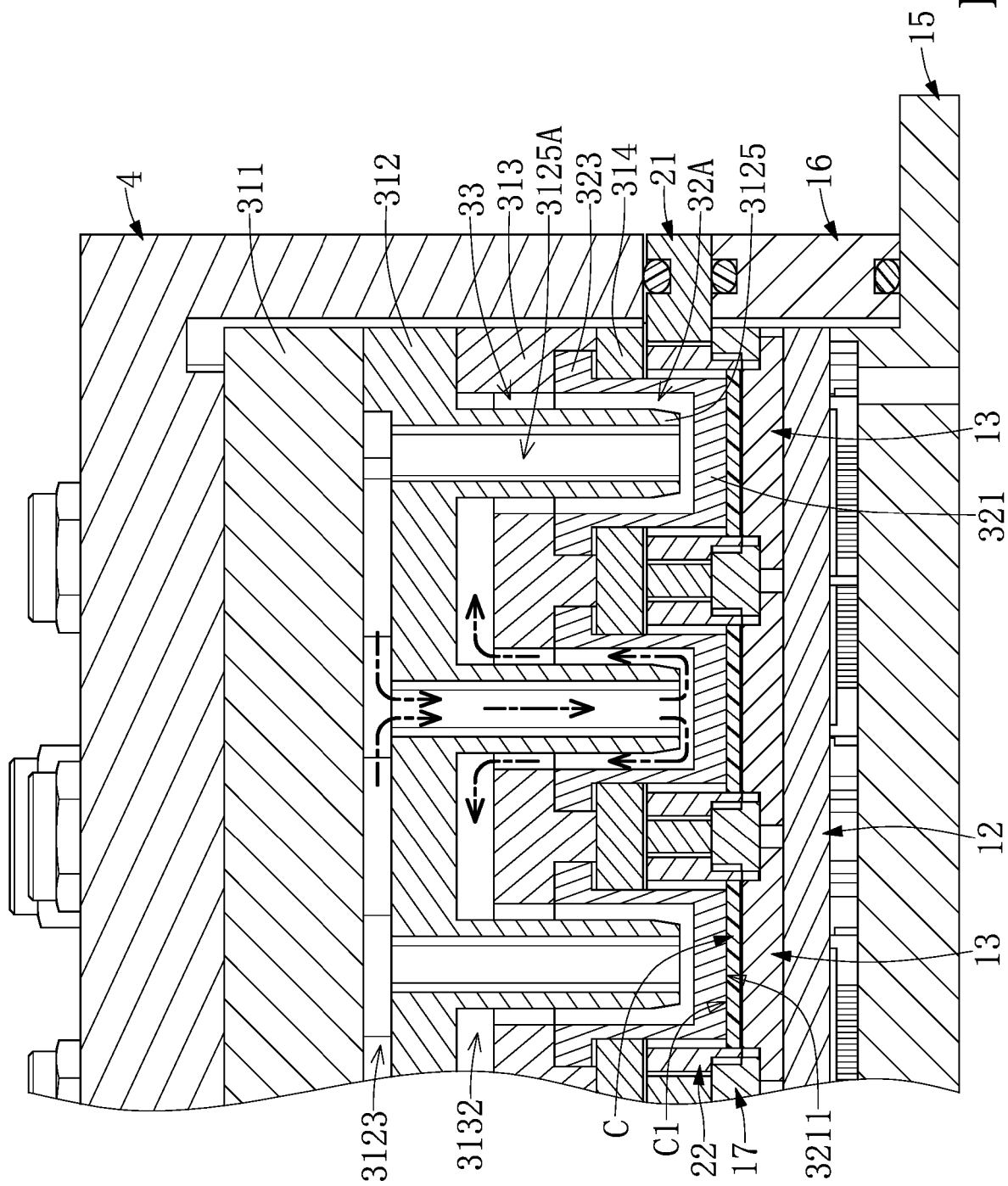
FIG. 24 is a cross-sectional view taken along line XXIV-XXIV in FIG. 1.

Referring to FIG. 22 and FIG. 23, the first main body thru-hole 3111 of the first component 311, the first temporary storage slot 3123, the first component thru-holes 3121, and the first guiding passages 3125A jointly define the first fluid channel L1, and each of the second main body thru-holes 3112 of the first component 311, the second temporary storage slot 3132, and the second guiding passages 33 jointly define the second fluid channels L2.

According to the above, a flowing path of the fluid having the predetermined temperature flowing to the fluid accommodating slot 32A of each of the pressing components 32 along the first fluid channel L1 of the main body 31 can be as follows. The fluid flows into the first temporary storage slot 3123 of the second component 312 from the first main body thru-hole 3111 of the first component 311. Afterwards, the fluid enters into each of the first guiding passages 3125A through the second component thru-holes 3131 of the second component 312, and the fluid then flows into the fluid accommodating slots 32A along the first guiding passages 3125A.

When the fluid continuously flows into each of the fluid accommodating slots 32A from the first fluid channel L1, the fluid arranged in each of the fluid accommodating slots 32A flows into the second temporary storage slot 3132 along the second guiding passage 33. When the second temporary storage slot 3132 is filled with the fluid, the fluid flows out of the main body 31 along the connection thru-holes 3122 of the second component 312 and the second main body thru-holes 3112.

In a practical application, the fluid supply apparatus can be connected to the tube connector A disposed on the first main body thru-hole 3111 through a tube, and the fluid supply apparatus can continuously provide the fluid to the main body 31 through the tube. The tube connector A disposed on each of the second main body thru-holes 3112 can be connected to a related fluid recycling apparatus through a tube. In one embodiment of the present disclosure, the fluid recycling apparatus can draw out the fluid in the main body 31 through the tubes. In another embodiment of the present disclosure, the fluid recycling apparatus and the fluid supply apparatus can be incorporated into a same apparatus.

It is worth mentioning that through the design of the first temporary storage slot 3123, the fluid having the predetermined temperature can substantially flow into all of the fluid accommodating slots 32A at the same time, and a fluid temperature of each of the fluid accommodating slots 32A can be substantially uniform. Through the design of the second temporary storage slot 3132, the fluid required to be recycled can be converged and jointly flows out of the main body 31 through the second main body thru-holes 3112 whose quantity is relatively less.

Figure 19:
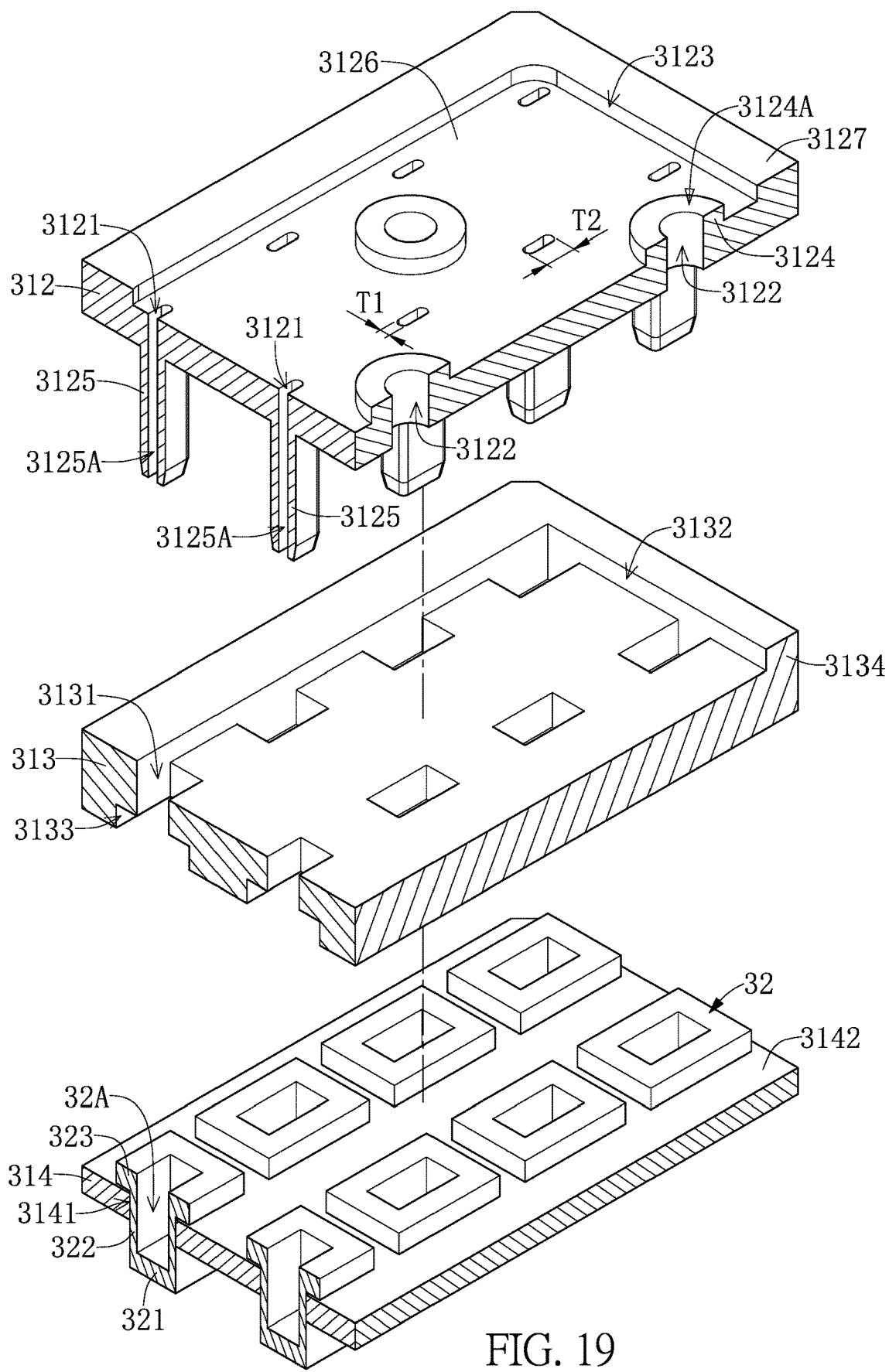
FIG. 19 is a partial cross-sectional exploded view of a second component, a third component, and a supporting component of the temperature adjusting device of the present disclosure.
Figure 20:
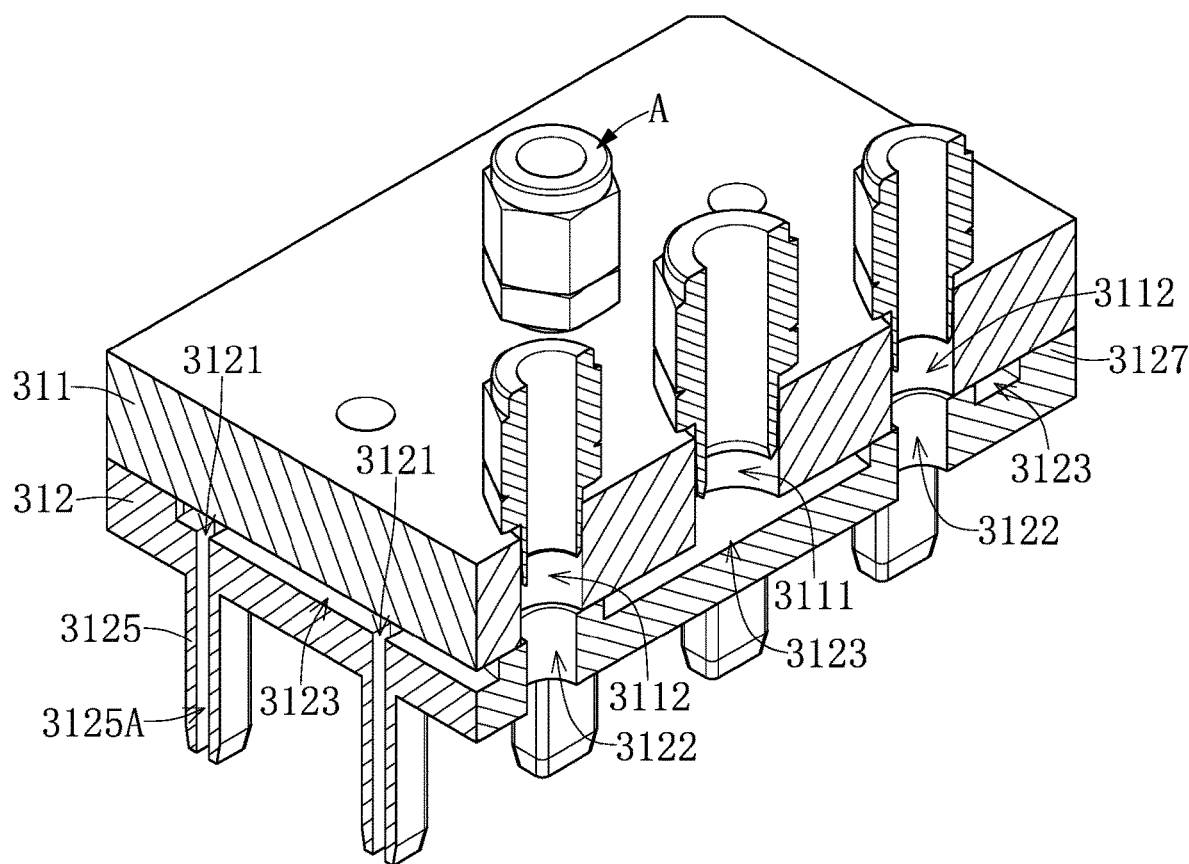
FIG. 20 is a cross-partial sectional view of a first component and the second component of the temperature adjusting device of the chip testing apparatus of the present disclosure.

Referring to FIG. 19, in a preferable embodiment, the structure of each of the first component thru-holes 3121 can be substantially rectangular, and a length T2 of each of the first component thru-holes 3121 can be 300% of a width T1 thereof. For example, the width T1 can be 3 mm, and the length T2 can be 9 mm. Referring to FIG. 23, in a cross-sectional surface (as shown in FIG. 23) passing through a central axis P of the first guiding passage 3125A, a gap distance W1 between an end surface of the guiding structure 3125 arranged in the fluid accommodating slot 32A and the wall portion 321 is greater than or equal to 1 mm, and a width of the second guiding passage 33 is within a range from 1 mm to 2 mm. In this way, the fluid can smoothly flow in the first guiding passage 3125A and the second guiding passage 33, and the fluid having the predetermined temperature can stay at the wall portion 321 of each of the fluid accommodating slots 32A for a relatively long time. In one specific embodiment of the present disclosure, the gap distance W1 can be 1.5 mm, a maximum width W2 of the second passage 33 can be 1.75 mm, a minimum width W5 of the second guiding passage 33 can be 0.75 mm, and a length W3 of the first guiding passage 3125A can be 31 mm.

In a preferable embodiment, each of the pressing components 32 can be made of a metal material. In this way, when the fluid having the predetermined temperature is arranged in each of the fluid accommodating slots 32A, the fluid can better exchange heat with the chip C under test.

It should be noted that, the above-mentioned two temperature adjusting devices 3 and the lid 4, or a single one of the temperature adjusting devices 3 and the lid 4 can be independently manufactured, sold, or operated, and each of the temperature adjusting devices 3 is not limited to be jointly manufactured, sold, or operated with other components included by the chip testing apparatus 100.

Figure 2:
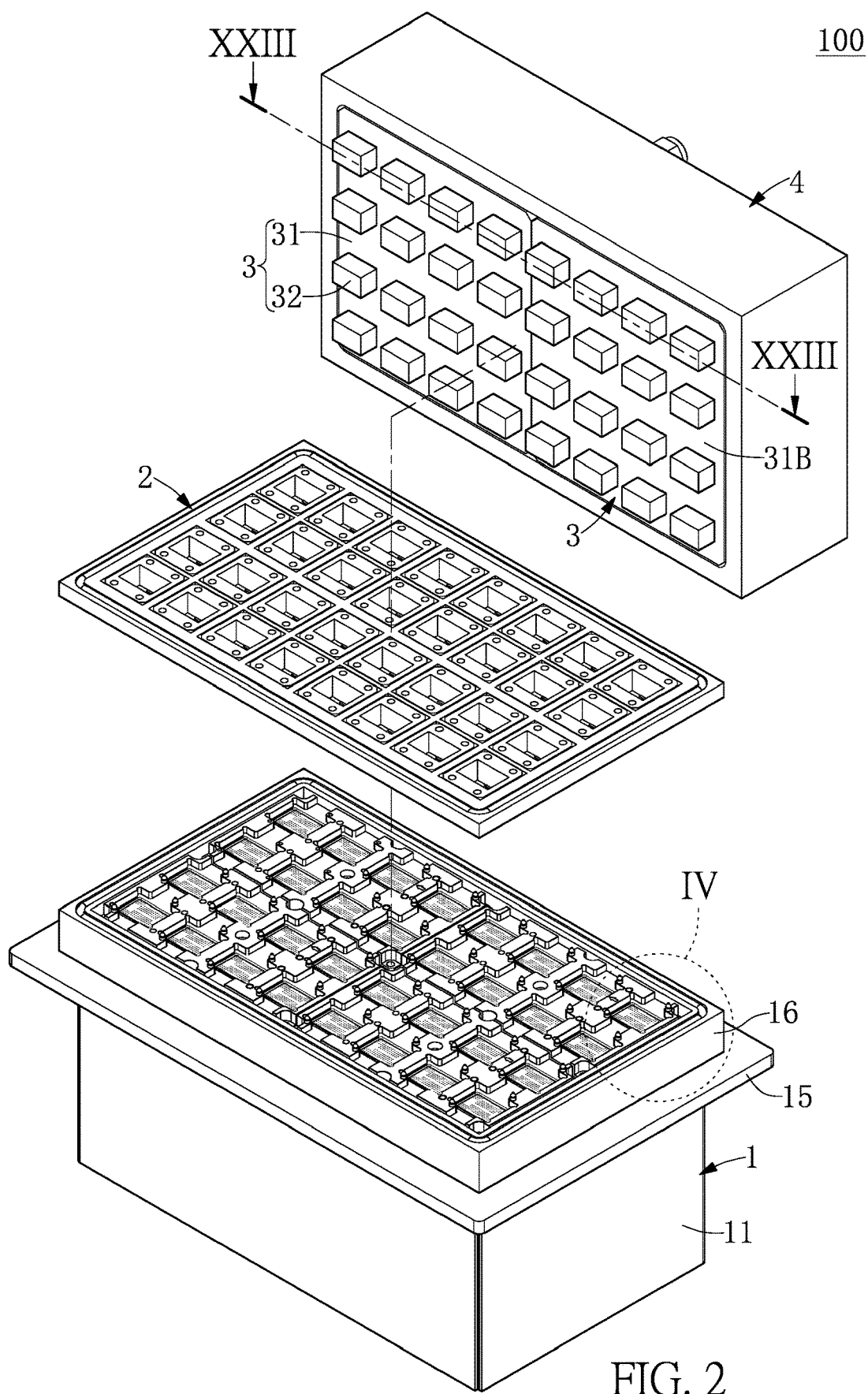
FIG. 2 is an exploded view of the chip testing apparatus of the present disclosure.
Figure 3:
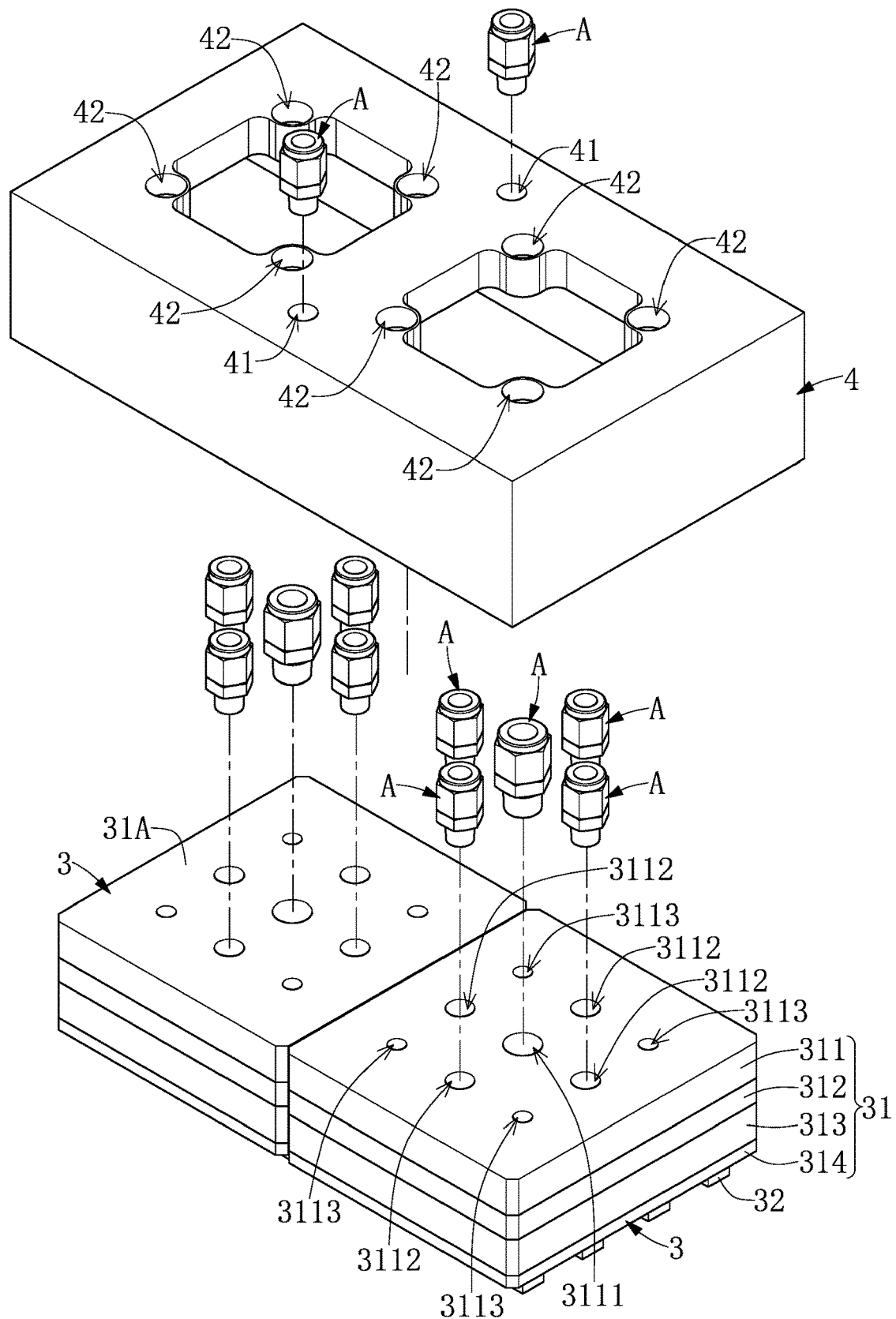
FIG. 3 is an exploded view of a lid and two temperature adjusting devices of the chip testing apparatus of the present disclosure.

According to the above, referring to FIG. 1 and FIG. 2, a process where the chip testing apparatus 100 of the present disclosure is utilized to perform the testing operation can be as follows.

Step 1 is implemented by utilizing the chip placement apparatus to place the chips C under test into the chip carrying sleeve 2.

Step 2 is implemented by moving the lid 4 and the two temperature adjusting devices 3 connected thereto away from the chip testing machine 1 and placing the chip carrying sleeve 2 carrying the chips C under test on one side of the hollow frame 16.

Step 3 is implemented by moving the lid 4 and the two temperature adjusting devices 3 toward the chip testing machine 1, so that the two temperature adjusting devices 3 are disposed on one side of the chip carrying sleeve 2 away from the hollow frame 16 and the pressing surface 3211 of each of the pressing components 32 is arranged near the surface C1 of the corresponding one of the chips C under test.

Step 4 is implemented by operating the air suction apparatus, so that the pressing surface 3211 of each of the pressing components 32 is tightly closed to the surface C1 of the corresponding one of the chips C under test.

Step 5 is implemented by allowing the fluid having the predetermined temperature to flow into the main body 31 through each of the first main body thru-holes 3111 and waiting for a predetermined time period so that each of the fluid accommodating slots 32A is filled with the fluid having the predetermined temperature.

Step 6 is implemented by allowing the testing module 14 to perform the testing operation to the chips C under test through the chip testing sockets 13.

In step 6, the fluid having the predetermined temperature can continuously flow into the main body 31 through the first main body thru-holes 3111, so that the temperature of the fluid in each of the fluid accommodating slots 32A is maintained at the predetermined temperature.

After the testing module 14 performs the testing operation to the chips C under test, a related control device (e.g., an industrial computer or server) controls the air suction apparatus to stop, so that the enclosed space S is recovered from the negative pressure state to a normal pressure state, and the related control device then controls the lid 4 and the two temperature adjusting devices 3 connected to lid 4 to move away from the chip testing machine 1. Finally, the related control device controls the related robotic arm to move the chip carrying sleeve 2 from the hollow frame 16 to a next working station. In a practical application, the lid 4 and the two temperature adjusting devices 3 connected thereto can be connected to the chip testing machine 1 through components such as a liner slide, and the lid 4 and the two temperature adjusting devices 3 connected thereto can move toward or away from the chip testing machine 1 through the liner slide. Naturally, the lid 4 and the two temperature adjusting devices 3 connected thereto can move relative to the chip testing machine 1 through various manners, and the present disclosure is not limited thereto.

It is worth mentioning that, generally, before an electronic product is assembled in a large quantity and mass-produced, it substantially undergoes two-stage tests. A first stage test of the two-stage tests is implemented by individually performing various electrical tests (i.e., ATE test) to each of the integrated circuits (i.e., IC) of the electronic product. If each of the integrated circuits passes the first stage test, a second stage test of the two-stage tests is implemented. In the second stage test, the integrated circuits that passed the first stage test are assembled into the electronic product or a state similar to the electronic product by relevant personnel or machines, and the electronic product is provided with electricity so that the electronic product is tested whether the integrated circuits normally work. Generally, the test is called as a system level test (SLT). Only if the electronic product passes the second stage test, the relevant personnel allows the electronic product to be massively produced. The chip testing apparatus 100 of the present disclosure can also be provided to perform the above-mentioned second stage test (i.e., the SLT).

BENEFICIAL EFFECTS OF THE EMBODIMENT

In conclusion, through the design of the temperature adjusting device of the chip testing apparatus of the present disclosure, each of the chips under test can undergo the testing operation in an environment having the predetermined temperature, and since each of the chips under test directly exchanges heat with the fluid having the predetermined temperature in each of the fluid accommodating slots, each of the chips under test can be tested in the environment having substantially the same predetermined temperature. In this way, the accuracy of the testing result of each of the chips under test can be ensured.

Conversely, in the conventional manner, the chips under test are disposed in an oven or a refrigerator. When the chips under test undergo the conventional testing operation, the chips under test are disposed at different positions in the oven or refrigerator, and the chips under test undergo the testing operation in environments having different temperatures. In this way, the final testing result is unreliable.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A temperature adjusting device configured to be disposed on a chip testing machine, wherein the chip testing machine includes at least one chip testing socket, and the at least one chip testing socket is configured to carry a chip under test, the temperature adjusting device comprising:

a main body including at least one first fluid channel and at least one second fluid channel therein, wherein the main body has at least one first main body thru-hole and at least one second main body thru-hole, the at least one first main body thru-hole is not in spatial communication with the at least one second main body thru-hole, the at least one first main body thru-hole is in spatial communication with the at least one first fluid channel, and the at least one second main body thru-hole is in spatial communication with the at least one second fluid channel; and at least one pressing component partially protruding from one side of the main body, wherein the at least one pressing component includes a fluid accommodating slot therein, the fluid accommodating slot is in spatial communication with the at least one first fluid channel, and the fluid accommodating slot is in spatial communication with the at least one second fluid channel, wherein other portions of the at least one first fluid channel other than one portion of the at least one first fluid channel that is in spatial communication with the fluid accommodating slot are not in spatial communication with the at least one second fluid channel, and wherein the at least one pressing component has a wall portion, the wall portion has a pressing surface, and the wall portion is an end wall of the fluid accommodating slot, wherein the at least one first main body thru-hole is provided so as to allow a fluid having a predetermined temperature to flow into the main body, the fluid entering into the main body from the at least one first main body thru-hole is configured to be guided by the at least one first fluid channel to flow into the fluid accommodating slot, and the fluid in the fluid accommodating slot is configured to enter into the at least one second fluid channel, flow along the at least one second fluid channel, and exit the main body from the at least one second main body thru-hole, and wherein, when the temperature adjusting device is fixed on the chip testing machine, the pressing surface of the at least one pressing component presses on a surface of the chip under test disposed on the at least one chip testing socket, or the pressing surface is disposed near the surface, and the fluid arranged in the fluid accommodating slot is configured to exchange heat with the chip under test through the wall portion.

2. The temperature adjusting device according to claim 1, wherein the main body includes at least one guiding structure therein, the at least one guiding structure has a first guiding passage therein, the first guiding passage is one portion of the at least one first fluid channel, one end of the at least one first guiding structure is arranged in the fluid accommodating slot, a second guiding passage is formed between the at least one guiding structure arranged in the fluid accommodating slot and a side wall forming the fluid accommodating slot, and the second guiding passage is one portion of the at least one second fluid channel.

3. The temperature adjusting device according to claim 2, wherein in a sectional surface passing through a central axis of the first guiding passage, a gap distance between an end surface of the at least one guiding structure arranged in the fluid accommodating slot and the wall portion is greater than or equal to 1 mm, and a width of the second guiding passage is within a range from 1 mm to 2 mm.

4. The temperature adjusting device according to claim 2, wherein the main body has a first temporary storage slot and a second temporary storage slot therein, the first temporary storage slot is one portion of the at least one first fluid channel, and the second temporary storage slot is one portion of the at least one second fluid channel, and wherein the first temporary storage slot is configured to temporarily store the fluid flowing into the main body from the at least one first main body thru-hole, the first temporary storage slot is in spatial communication with the first guiding passage, and the second temporary storage slot is in spatial communication with the second guiding passage.

5. The temperature adjusting device according to claim 4, wherein the main body includes a first component, a second component, and a third component, and the second component is disposed between the first component and the third component, wherein the first component includes the at least one first main body thru-hole and the at least one second main body thru-hole, wherein the second component includes at least one first component thru-hole, at least one connection thru-hole, the first temporary storage slot, at least one annular supporting structure, and the at least one guiding structure, the first component thru-hole penetrates through the second component, and the at least one connection thru-hole penetrates through the second component, wherein the first temporary storage slot is recessed on one side of the second component, and the at least one guiding structure protrudes from another side of the second component, wherein the at least one first component thru-hole is arranged in the first temporary storage slot, and the first temporary storage slot, the at least one first component thru-hole, and the first guiding passage are in spatial communication with each other, wherein the at least one annular supporting structure is arranged in the first temporary storage slot, wherein the first component is fixed to the one side of the second component having the first temporary storage slot, an end surface of the at least one annular supporting structure abuts against a wide surface of the first component, the at least one connection thru-hole is in spatial communication with the at least one second main body thru-hole, and the at least one connection thru-hole is not in spatial communication with the first temporary storage slot, wherein the third component has at least one second component thru-hole and the second temporary storage slot, and the at least one second component thru-hole penetrates through the third component, wherein the third component includes the at least one pressing component disposed on one side thereof away from the second temporary storage slot, and the at least one second component thru-hole, the fluid accommodating slot of the at least one pressing component, and the second temporary storage slot are in spatial communication with each other, and wherein the second component is disposed on the one side of the third component having the second temporary storage slot, the at least one guiding structure penetrates through the at least one second component thru-hole, one portion of the guiding structure is arranged in the fluid accommodating slot, and the at least one connection thru-hole of the second component is in spatial communication with the second temporary storage slot.

6. The temperature adjusting device according to claim 5, wherein the at least one annular supporting structure is disposed around the at least one connection thru-hole, and when the first component is fixed to the one side of the second component, the at least one annular supporting structure is configured to allow the at least one connection thru-hole to be not in spatial communication with the first temporary storage slot.

7. The temperature adjusting device according to claim 6, wherein the main body further includes a supporting component, the supporting component has at least one retaining hole, and at least one engaging structure is formed away from the one side of the third component having the second temporary storage slot, wherein the at least one pressing component has an engaging portion and a pressing portion, the pressing portion has the fluid accommodating slot therein, and the engaging portion is arranged away from one end of the pressing portion having the wall portion, and wherein the pressing portion penetrates through the at least one retaining hole, the engaging portion abuts against one side surface of the supporting component, the third component is fixed to one side of the supporting component, and the at least one engaging structure and the engaging portion are engaged with each other.

8. The temperature adjusting device according to claim 7, wherein the at least one engaging structure is recessed in a direction away from the one side of the third component having the second temporary storage slot, the engaging portion is engaged in the at least one engaging structure, and one side of the third component having the at least one engaging structure abuts against one side of the at least one annular supporting structure.

9. The temperature adjusting device according to claim 5, wherein a length of the at least one first component thru-hole is 300% of a width of the at least one first component thru-hole.

10. The temperature adjusting device according to claim 1, wherein the at least one pressing component is made of a metal material.

* * * * *